US012685174B2

(12) United States Patent
Li et al.

(10) Patent No.: US 12,685,174 B2
(45) Date of Patent: Jul. 14, 2026

(54) RFSOI SEMICONDUCTOR STRUCTURES INCLUDING AN ELECTROMAGNETIC SHIELD LAYER AND METHODS OF MANUFACTURING THE SAME

(71) Applicant: Taiwan Semiconductor Manufacturing Company Limited, Hsinchu (TW)

(72) Inventors: Fu-Hai Li, Tainan City (TW); Chien Hung Liu, Hsinchu (TW); Hsien Jung Chen, Hsinchu (TW); Kuo-Ching Huang, Hsinchu City (TW); Harry-Hak-Lay Chuang, Zhubei City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 523 days.

(21) Appl. No.: 18/317,994

(22) Filed: May 16, 2023

(65) Prior Publication Data

US 2024/0387399 A1 Nov. 21, 2024

(51) Int. Cl.
H10W 42/20 (2026.01)
H10W 20/20 (2026.01)
(Continued)

(52) U.S. Cl.
CPC ........... H10W 42/20 (2026.01); H10W 20/20 (2026.01); H10W 20/497 (2026.01); H10W 80/327 (2026.01); H10W 80/334 (2026.01)

(58) Field of Classification Search
CPC . H01L 23/552; H01L 23/481; H01L 23/5227;
H01L 24/80; H01L 2224/80203; H01L
2224/80896; H01L 2223/6677; H01L
23/645; H01L 23/66; H10W 42/20;
H10W 20/20; H10W 20/497; H10W
80/327; H10W 80/334; H10W 44/248;
H10W 44/20; H10W 44/501
See application file for complete search history.

(56) References Cited

U.S. PATENT DOCUMENTS

2009/0075428 A1* 3/2009 Tang ..................... H01L 21/561
438/114
2019/0393148 A1* 12/2019 Uchida .................. H10D 84/85
(Continued)

FOREIGN PATENT DOCUMENTS

TW 200516708 A 5/2005

OTHER PUBLICATIONS

Jianq Chyun Intellectual Property Office; TW Application No. 112125954; Office Action mailed May 22, 2024; 8 pages.

*Primary Examiner* — Herve-Louis Y Assouman
(74) *Attorney, Agent, or Firm* — The Marbury Law Group, PLLC

(57) ABSTRACT

A semiconductor may include a handle substrate, a semiconductor material layer on which semiconductor devices, metal interconnect structures, dielectric material layers, and an inductor structure are located, and a patterned magnetic shielding layer including at least one portion of a ferromagnetic material having relative permeability of at least 20 and disposed between the semiconductor material layer and the handle substrate and reducing electromagnetic coupling between the inductor structure and the handle substrate.

20 Claims, 35 Drawing Sheets

(51) Int. Cl.
    *H10W 20/40*     (2026.01)
    *H10W 44/00*     (2026.01)
    *H10W 44/20*     (2026.01)
    *H10W 80/00*     (2026.01)

(56)             References Cited

U.S. PATENT DOCUMENTS

| | | |
|---|---|---|
| 2020/0006633 A1 | 1/2020 | Lille |
| 2022/0077565 A1 | 3/2022 | Samardzija et al. |

* cited by examiner

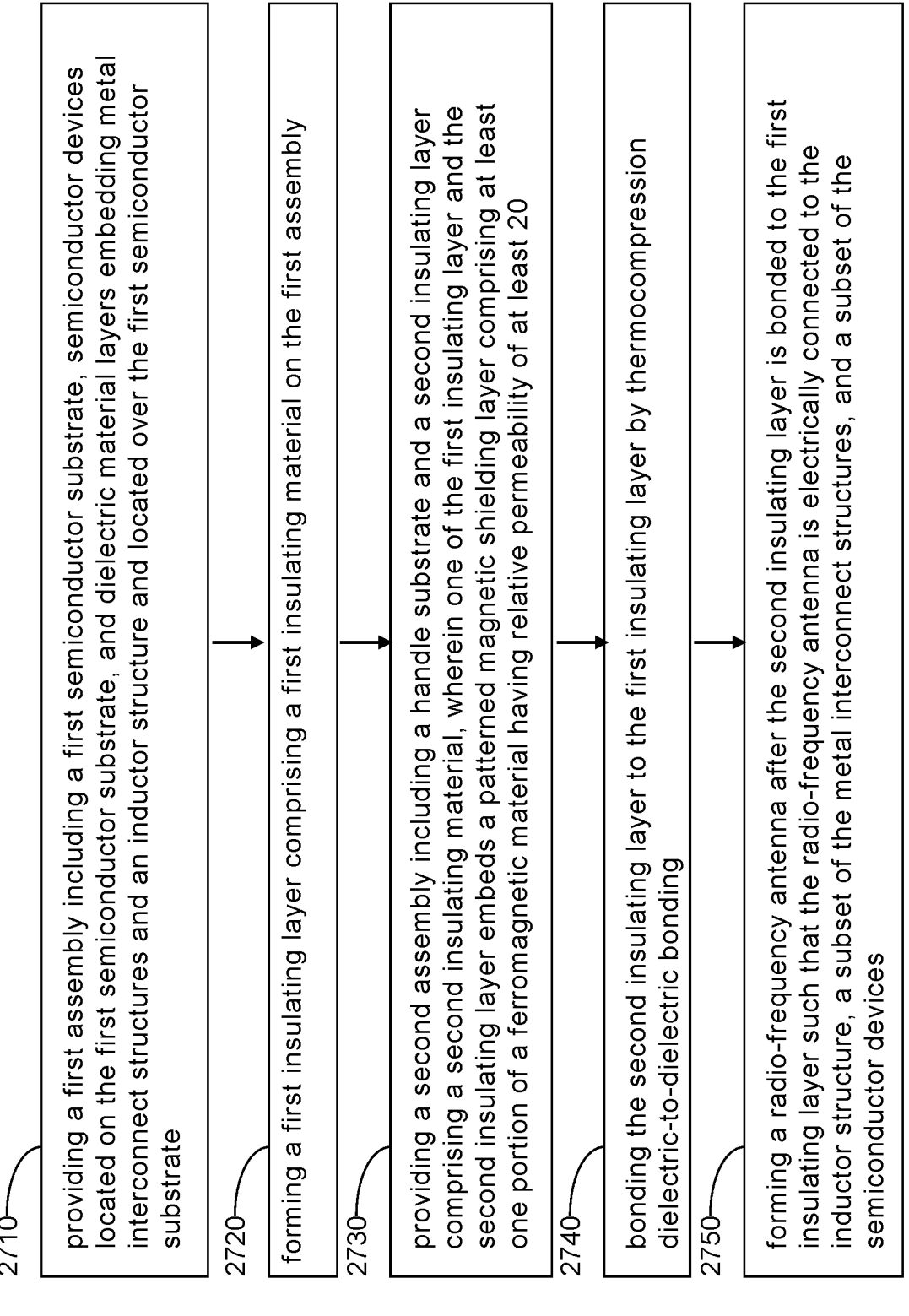

2710 — providing a first assembly including a first semiconductor substrate, semiconductor devices located on the first semiconductor substrate, and dielectric material layers embedding metal interconnect structures and an inductor structure and located over the first semiconductor substrate 2720 — forming a first insulating layer comprising a first insulating material on the first assembly 2730 — providing a second assembly including a handle substrate and a second insulating layer comprising a second insulating material, wherein one of the first insulating layer and the second insulating layer embeds a patterned magnetic shielding layer comprising at least one portion of a ferromagnetic material having relative permeability of at least 20

2740 — bonding the second insulating layer to the first insulating layer by thermocompression dielectric-to-dielectric bonding 2750 — forming a radio-frequency antenna after the second insulating layer is bonded to the first insulating layer such that the radio-frequency antenna is electrically connected to the inductor structure, a subset of the metal interconnect structures, and a subset of the semiconductor devices

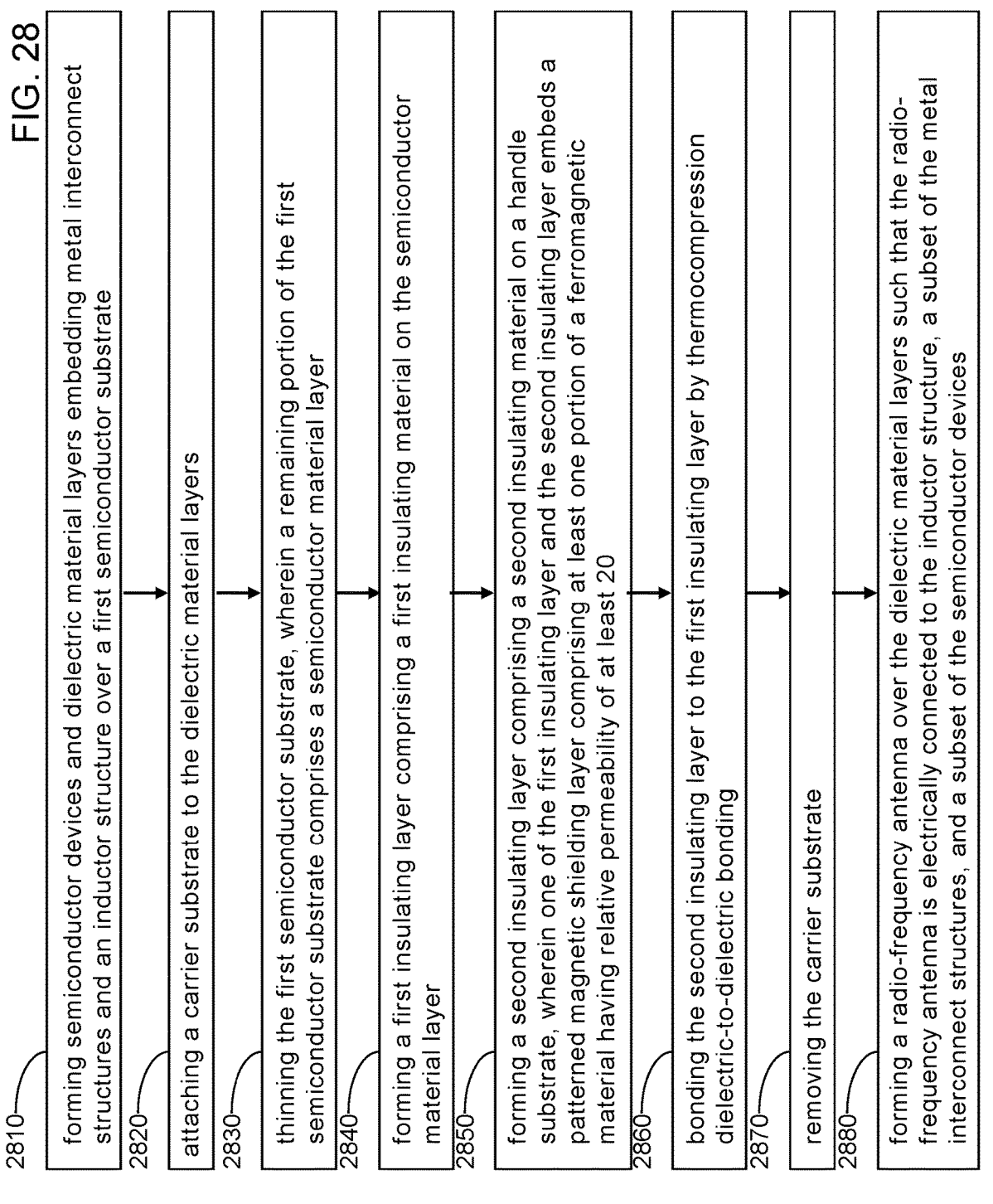

2810 — forming semiconductor devices and dielectric material layers embedding metal interconnect structures and an inductor structure over a first semiconductor substrate 2820 — attaching a carrier substrate to the dielectric material layers 2830 — thinning the first semiconductor substrate, wherein a remaining portion of the first semiconductor substrate comprises a semiconductor material layer 2840 — forming a first insulating layer comprising a first insulating material on the semiconductor material layer 2850 — forming a second insulating layer comprising a second insulating material on a handle substrate, wherein one of the first insulating layer and the second insulating layer embeds a patterned magnetic shielding layer comprising at least one portion of a ferromagnetic material having relative permeability of at least 20

2860 — bonding the second insulating layer to the first insulating layer by thermocompression dielectric-to-dielectric bonding 2870 — removing the carrier substrate 2880 — forming a radio-frequency antenna over the dielectric material layers such that the radio-frequency antenna is electrically connected to the inductor structure, a subset of the metal interconnect structures, and a subset of the semiconductor devices

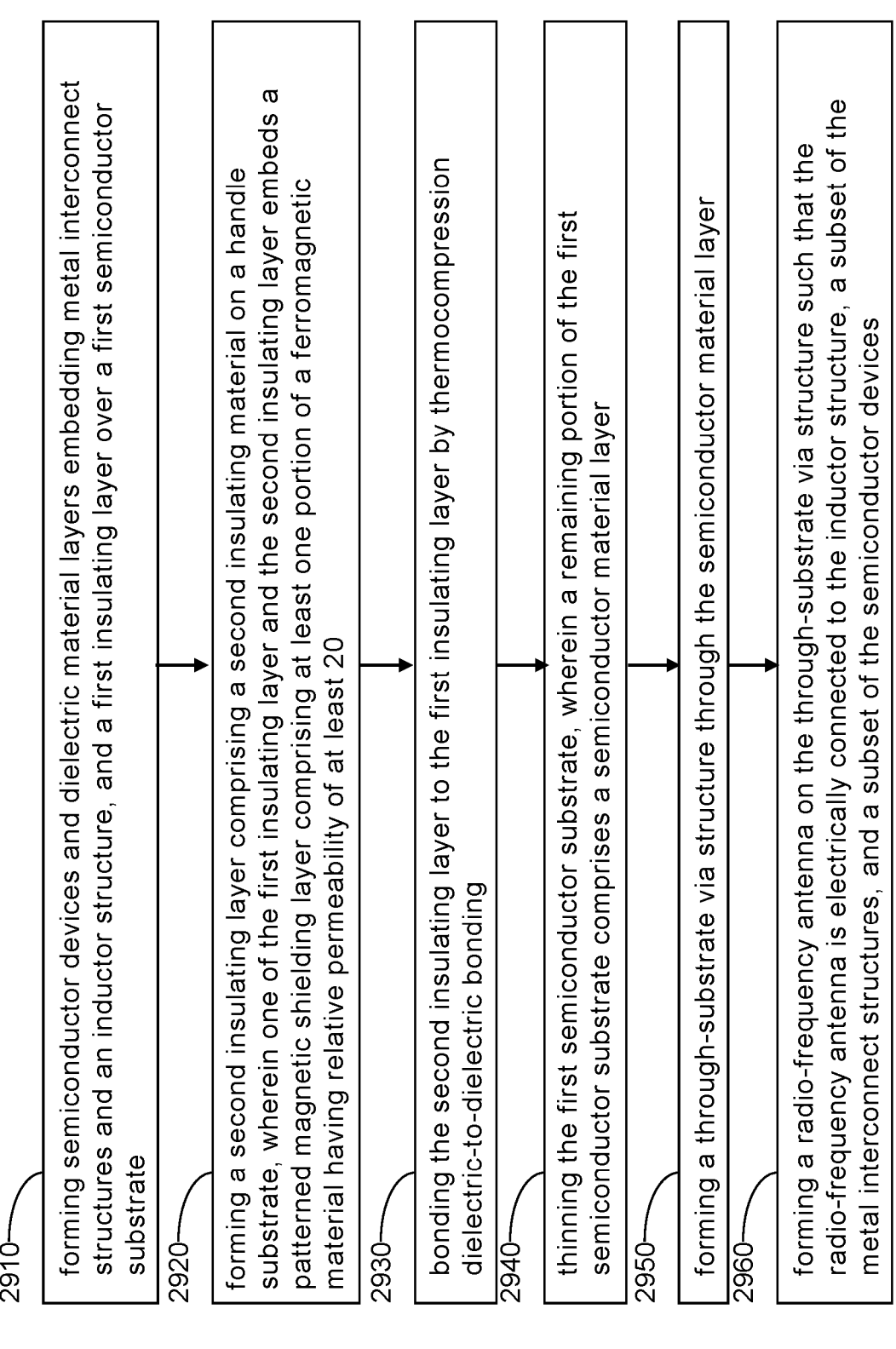

2910 — forming semiconductor devices and dielectric material layers embedding metal interconnect structures and an inductor structure, and a first insulating layer over a first semiconductor substrate 2920 — forming a second insulating layer comprising a second insulating material on a handle substrate, wherein one of the first insulating layer and the second insulating layer embeds a patterned magnetic shielding layer comprising at least one portion of a ferromagnetic material having relative permeability of at least 20

2930 — bonding the second insulating layer to the first insulating layer by thermocompression dielectric-to-dielectric bonding 2940 — thinning the first semiconductor substrate, wherein a remaining portion of the first semiconductor substrate comprises a semiconductor material layer 2950 — forming a through-substrate via structure through the semiconductor material layer 2960 — forming a radio-frequency antenna on the through-substrate via structure such that the radio-frequency antenna is electrically connected to the inductor structure, a subset of the metal interconnect structures, and a subset of the semiconductor devices

FIG. 29

RFSOI SEMICONDUCTOR STRUCTURES INCLUDING AN ELECTROMAGNETIC SHIELD LAYER AND METHODS OF MANUFACTURING THE SAME

BACKGROUND

Radio-frequency (RF) devices may be formed on a semiconductor-on-insulator (SOI) substrate including a thin semiconductor material layer, a buried insulating layer, and a handle substrate. Inductive or capacitive coupling between the RF devices and the handle substrate may decrease performance of the RF devices such a the Q-factor of an inductor, etc. It is desirable to reduce the impedance coupling between the RF devices and the handle substrate in order to enhance performance of the RF devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 27 is a first process flowchart for forming the first structure and second structure of the present disclosure.

FIG. 28 is a second process flowchart for forming the first structure and second structure of the present disclosure.

FIG. 29 is a third process flowchart for forming the first structure and second structure of the present disclosure.

DETAILED DESCRIPTION

Figure 1:
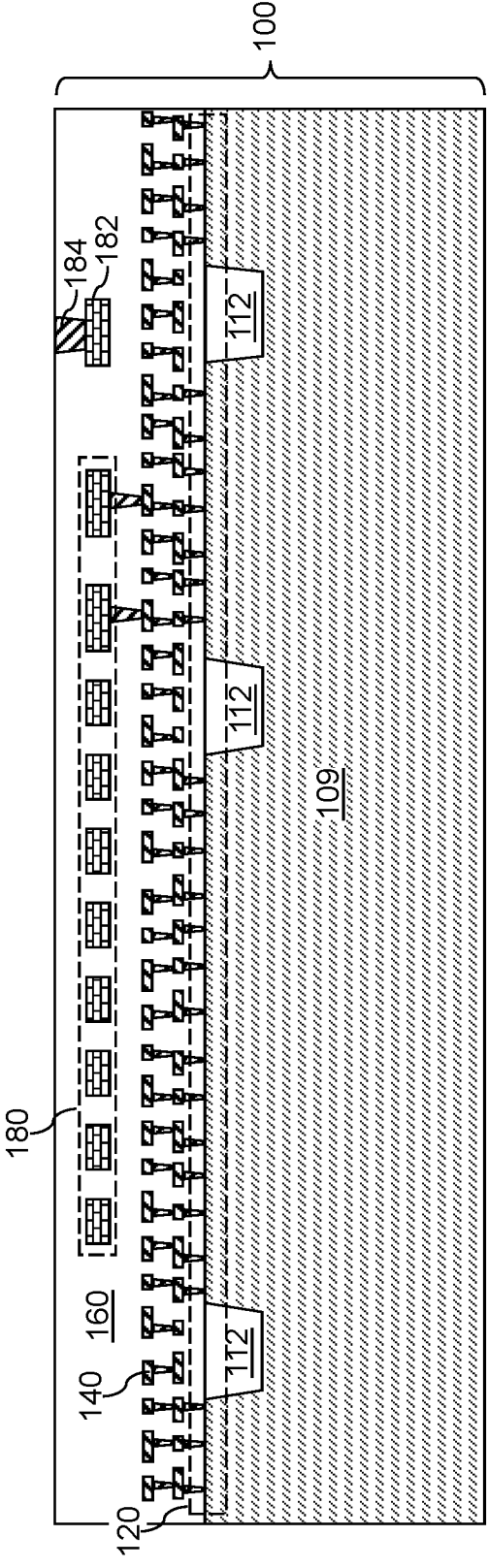
FIG. 1 is a vertical cross-sectional view of a first structure after formation of semiconductor devices, metal interconnect structures, and an inductor structure embedded in dielectric material layers over a first semiconductor substrate according to a first embodiment of the present disclosure.

The present disclosure is directed generally to semiconductor devices, and specifically to radio frequency semiconductor-on-insulator (RFSOI) semiconductor structures including an electromagnetic shield layer and methods of manufacturing the same.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Radio-frequency devices may be formed on a semiconductor substrate to provide radio-frequency signal reception, processing, and emission. For example, low noise amplifiers may be used to receive radio-frequency signals, and power amplifiers may be used to generate radio-frequency signals that are to be transmitted by an antenna. Passive devices such as inductor structures and capacitor structures may be used to form radio-frequency circuits that may process the radio-frequency signals. Electromagnetic interference induced by inductor structures may pose limitation on the performance of such radio-frequency circuits. For example, eddy current and secondary magnetic fields that are induced in a bulk semiconductor substrate by inductor structures may reduce the alternating current impedance of the bulk semiconductor substrate and consequently decrease the Q-factor of a resonant circuit including a respective inductor structure.

In addition, inductive coupling may occur in instances in which a change in current flow in one circuit produces a voltage across a nearby circuit through mutual inductance. In the case of RF devices, in instances in which the handle substrate is not properly designed, it may act as a secondary coil in an inductive coupling scenario, causing a portion of the RF signal to be coupled into the substrate. This can result in a decrease in the Q-factor of the inductor, which is a measure of its efficiency. The Q-factor is inversely proportional to the amount of energy lost in the circuit, so if the Q-factor is low, it means that more energy is being lost.

Similarly, capacitive coupling may occur in instances in which a change in voltage across one circuit produces a current flow in a nearby circuit through mutual capacitance. In instances in which the handle substrate is not properly designed, it may act as a capacitor in a capacitive coupling scenario, causing a portion of the RF signal to be coupled into the substrate. This can also result in a decrease in the Q-factor of the inductor.

To minimize the effects of inductive and capacitive coupling on the performance of RF devices, it is important to use a handle substrate that is designed to have low inductive and capacitive coupling with the RF devices. This can be achieved through the use of materials and design techniques that minimize the amount of RF energy that is coupled into the substrate.

In some implementations, a high-resistance silicon substrate is used as a bulk substrate to increase the Q-factor of resonant circuits that are formed over a semiconductor-on-insulator (SOI) layer. However, such a high-resistance silicon substrate is difficult to manufacture and is costly. Embodiments of the present disclosure provide a structure and method that may decrease the electromagnetic coupling between passive devices (such as inductor structures) in a radio-frequency circuit and an underlying handle substrate including a bulk semiconductor material. Specifically, a patterned magnetic shielding layer may be interposed between a handle substrate including a semiconductor material and a semiconductor-on-insulator (SOI) semiconductor material layer on which semiconductor devices (such as field effect transistors) may be formed.

Electromagnetic coupling between the handle substrate and passive devices that are formed over the semiconductor devices may be reduced through use of the patterned magnetic shielding layer. The patterned magnetic shielding layer may be embedded in an insulating material layer, which may be formed on a top side of the handle substrate or on a bottom side of a semiconductor material layer on which the semiconductor devices are present. Generally, a first insulating layer may be formed on an assembly including a semiconductor material layer, semiconductor devices, and an inductor structure, and a second insulating layer may be formed on a handle substrate including a bulk semiconductor substrate. The patterned magnetic shielding layer may be embedded within the first insulating layer or within the second insulating layer. The first insulating layer and the second insulating layer may be bonded to each other by thermocompressive dielectric-to-dielectric bonding.

Referring to FIG. 1, a vertical cross-sectional view of a first structure according to a first embodiment of the present disclosure is illustrated. The first structure comprises a first semiconductor substrate 109, semiconductor devices 120 formed on a top side of the first semiconductor substrate 109, and dielectric material layers 160 formed over the semiconductor devices 120. Metal interconnect structures 140 and an inductor structure 180 may be formed in the dielectric material layers 160. Thus, the dielectric material layers 160 embeds the metal interconnect structures 140 and the inductor structure 180.

The first semiconductor substrate 109 may comprise a commercially available semiconductor substrate such as a single crystalline silicon substrate. In one embodiment, the first semiconductor substrate 109 comprises a single crystalline silicon substrate having a thickness in a range from 100 microns to 2 mm. The first semiconductor substrate 109 may be doped with electrical dopants, which may be p-type dopants or n-type dopants. The atomic concentration of electrical dopants in the first semiconductor substrate 109 may be optimized based on the desired performance desired parameters of the semiconductor devices 120. For example, the atomic concentration of electrical dopants in the first semiconductor substrate 109 may be in a range from $1.0 \times 10^{12}/\text{cm}^3$ to $1.0 \times 10^{16}/\text{cm}^3$, such as $1.0 \times 10^{13}/\text{cm}^3$ to $1.0 \times 10^{15}/\text{cm}^3$, although lesser and greater atomic concentrations may also be used.

Shallow trench isolation structures 112 may be formed in an upper portion of the first semiconductor substrate 109. The vertical extent of the shallow trench isolation structures 112 may be in a range from 100 nm to 1,000 nm, such as from 200 nm to 500 nm, although lesser and greater thicknesses may also be used. Each shallow trench isolation structure 112 may have a greater lateral extent at a top surface than at a bottom surface due to a finite taper angle of shallow trenches that are formed in the upper portion of the first semiconductor substrate 109.

The semiconductor devices 120 may comprise various semiconductor devices known in the art. For example, the semiconductor devices 120 may comprise various field effect transistors that form radio-frequency circuits such as low noise amplifier (LNA) circuits used to receive and amplify a radio-frequency signal, and power amplification circuits used to generate a radio-frequency signal for transmission to a radio-frequency signal emission circuit including the inductor structure 180 and a radio-frequency antenna to be subsequently formed. In one embodiment, the semiconductor devices 120 comprise field effect transistors configured to operate in a frequency range from 1 GHz to 100 GHz. In one embodiment, the semiconductor devices 120 comprise a radio-frequency circuit including at least one capacitor and at least inductor and configured to operate in a frequency range from 1 GHz to 100 GHz. The semiconductor devices 120 may comprise complementary metal-oxide-semiconductor (CMOS) field effect transistors that function as components of various circuits such as the LNA circuits and the power amplification circuits. The semiconductor devices 120 may comprise some passive devices such as capacitor structures. Alternatively or additionally, metal-insulator-metal capacitors (MIMCAPs; not shown) may be formed within the dielectric material layers 160 below the level of, at the same level as, and/or above the level of, the inductor structure 180.

The metal interconnect structures 140 may include metal via structures and metal line structures that are configured to provide electrical connection to and from the semiconductor devices 120 and between a subset of the semiconductor devices 120 and the inductor structure 180. Generally, multiple levels of metal interconnect structures 140 may be formed, which comprises via levels and line levels. The metal interconnect structures 120 may be formed using single damascene methods, dual damascene methods, and/or deposition and patterning of metal layers.

The dielectric material layers 160 may comprise any known interlayer dielectric (ILD) material known in the art, which include, for example, undoped silicate glass, doped silicate glasses, porous or non-porous organosilicate glasses, silicon nitride, silicon carbide nitride, silicon oxynitride, and/or dielectric metal oxides. Other suitable dielectric materials may be within the contemplated scope of disclosure. The total thickness of the dielectric material layers 160 may be in a range from 1 micron to 10 microns, such as from 2 microns to 5 microns, although lesser and greater thicknesses may also be used.

The inductor structure 180 may be formed above the metal interconnect structures 140 or at a topmost level of the metal interconnect structures 140. Generally, the inductor structure 180 may be formed in any inductor configuration known in the art. The types of inductor structure 180 that may be used in the structure include, but are not limited to, coaxial types, spiral types, solenoid types, toroidal types, etc. The inductor structure 180 may be formed in a single level or over multiple levels, and may be formed in a spiral configuration or in a non-spiral configuration.

Antenna connection structures (182, 184) may be formed at, or above, the level(s) of the inductor structure 180. The antenna connection structures (182, 184) may comprise at least one antenna connection metal line 182 and at least one antenna connection via structure 184. The antenna connection structures (182, 184) may be electrically connected to, and/or electrically shorted (i.e., unintended electrical connections) to, the inductor structure 180 and/or a subset of the semiconductor devices 120 in the LNA circuits and the power amplification circuits. A first assembly 100 is formed, which may comprise a first semiconductor substrate 109, semiconductor devices 120, and dielectric material layers 160 embedding metal interconnect structures 140 and an inductor structure 180.

A topmost insulating layer selected from the insulating layers 160 may be located at the level of the inductor structure 180, or may be formed above the level of the inductor structure 180. While the present disclosure is described using an embodiment in which the topmost insulating layer overlies the inductor structure 180, embodiments are expressly contemplated herein in which a top surface of the topmost insulating layer is coplanar with top surface of the inductor structure 180.

Figure 2:
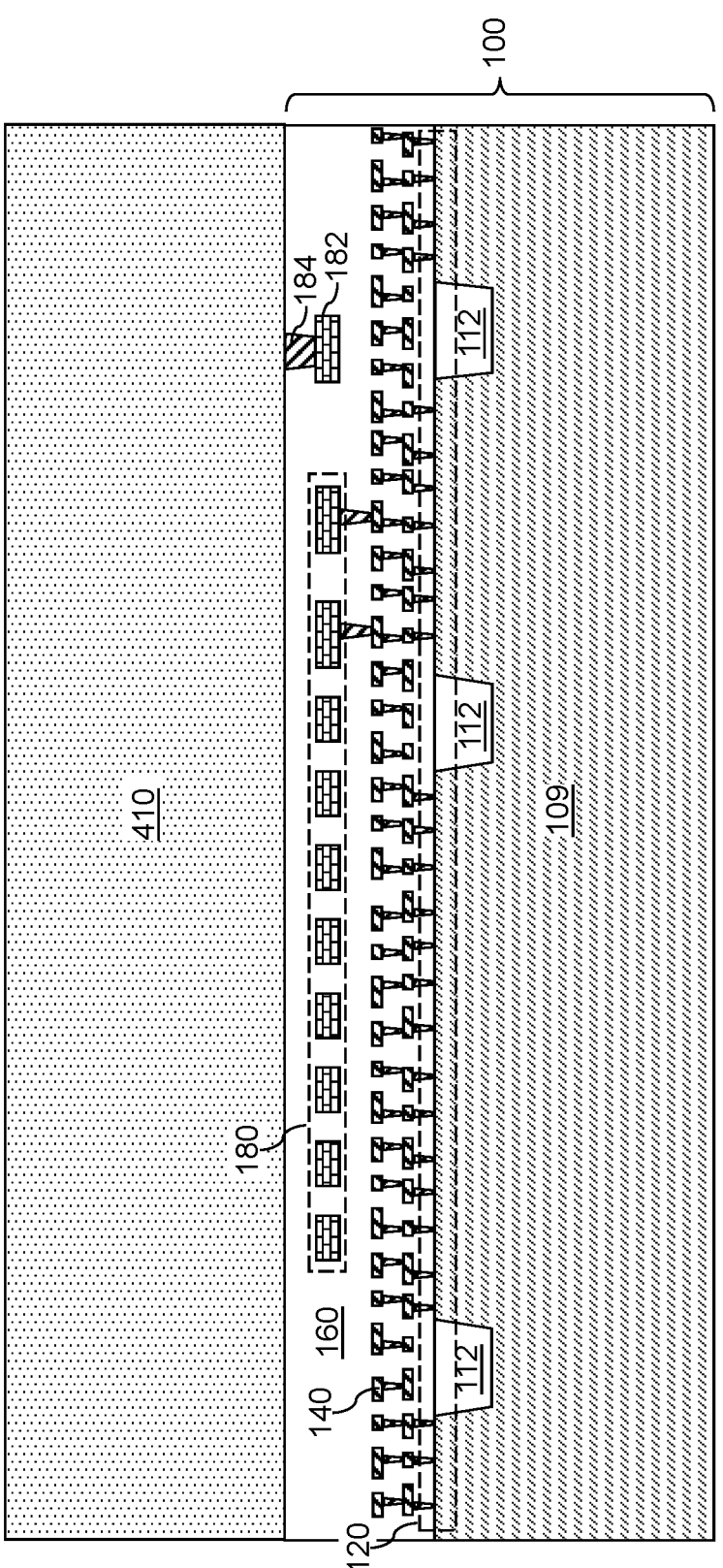
FIG. 2 is a vertical cross-sectional view of the first structure after attaching a carrier substrate to the dielectric material layers according to the first embodiment of the present disclosure.

Referring to FIG. 2, a carrier substrate 410 may be bonded to the physically exposed top surface of the dielectric material layers 160 on an opposite side of the first semiconductor substrate 109. The carrier substrate 410 may comprise a semiconductor material, an insulating material, and/or a conductive material. The carrier substrate 410 may have a thickness in a range from 300 microns to 2 mm, such as from 600 microns to 1 mm, although lesser and greater thicknesses may also be used. In some embodiments, the carrier substrate 410 may comprise an optically transparent material. The carrier substrate 410 may be attached to the dielectric material layers 160 using an adhesive material layer (not shown), which may comprise, for example, a thermally-decomposable adhesive material layer or an ultra-violet-decomposable adhesive material layer.

Figure 3:
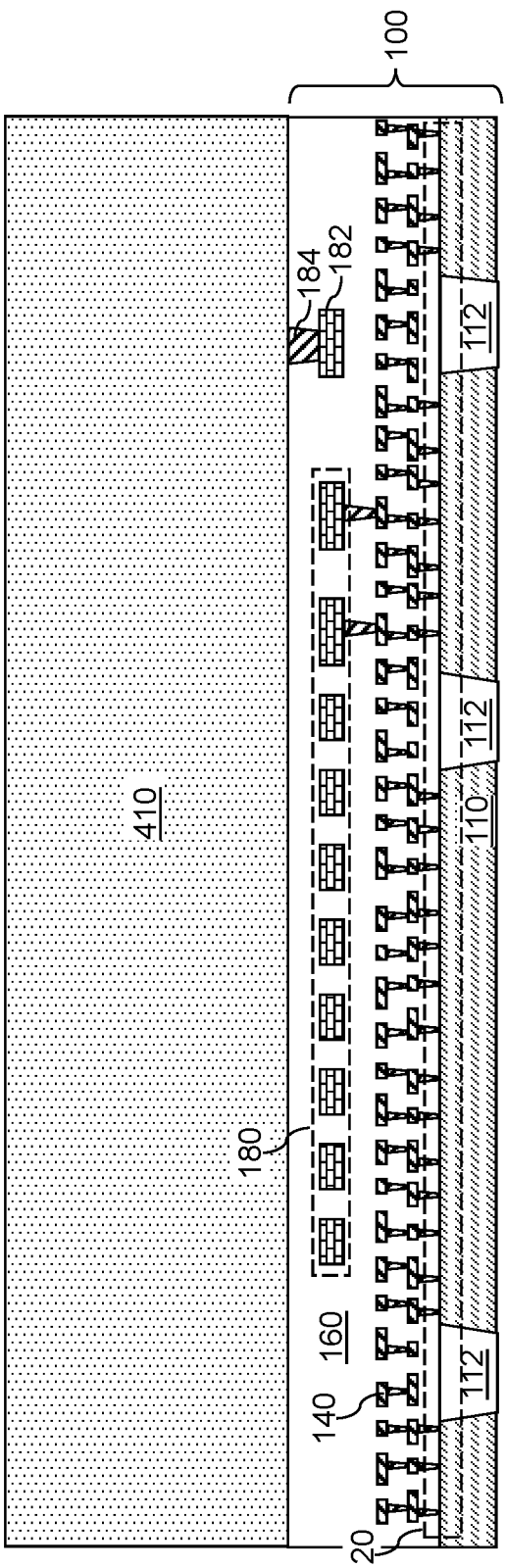
FIG. 3 is a vertical cross-sectional view of the first structure after thinning the first semiconductor substrate according to the first embodiment of the present disclosure.

Referring to FIG. 3, the first semiconductor substrate 109 may be thinned by removing the backside portion of the first semiconductor substrate 109. For example, the backside portion of the first semiconductor substrate 109 may be removed by grinding, polishing, an isotropic etch process, and/or an anisotropic etch process. A remaining portion of the first semiconductor substrate 109 comprises a semiconductor material layer 110. The thickness of the semiconductor material layer 110 may be in a range from 100 nm to 5,000 nm, such as from 200 nm to 2,000 nm, although lesser and greater thicknesses may also be used.

The thickness of the semiconductor material layer 110 may, or may not, be greater than the thickness of the shallow trench isolation structures 112. In some embodiments, backside surfaces of the shallow trench isolation structures 112 may be physically exposed after thinning the first semiconductor substrate 109 into the semiconductor material layer 110. In some other embodiments, the shallow trench isolation structures 112 may not be physically exposed after thinning the first semiconductor substrate 109 into the semiconductor material layer 110. In one embodiment, the semiconductor material layer 110 may comprise, and/or may consist of, a single crystalline semiconductor material layer such as a single crystalline silicon layer. The first assembly 100 comprises a semiconductor material layer 110, semiconductor devices 120 located on the semiconductor material layer 110, and dielectric material layers 160 embedding metal interconnect structures 140 and an inductor structure 180 and located over the semiconductor material layer. The carrier substrate 410 provides structural support to the first assembly 100, and prevents breakage of the semiconductor material layer 110 which as a lesser thickness than the first semiconductor substrate 109.

Figure 4A:
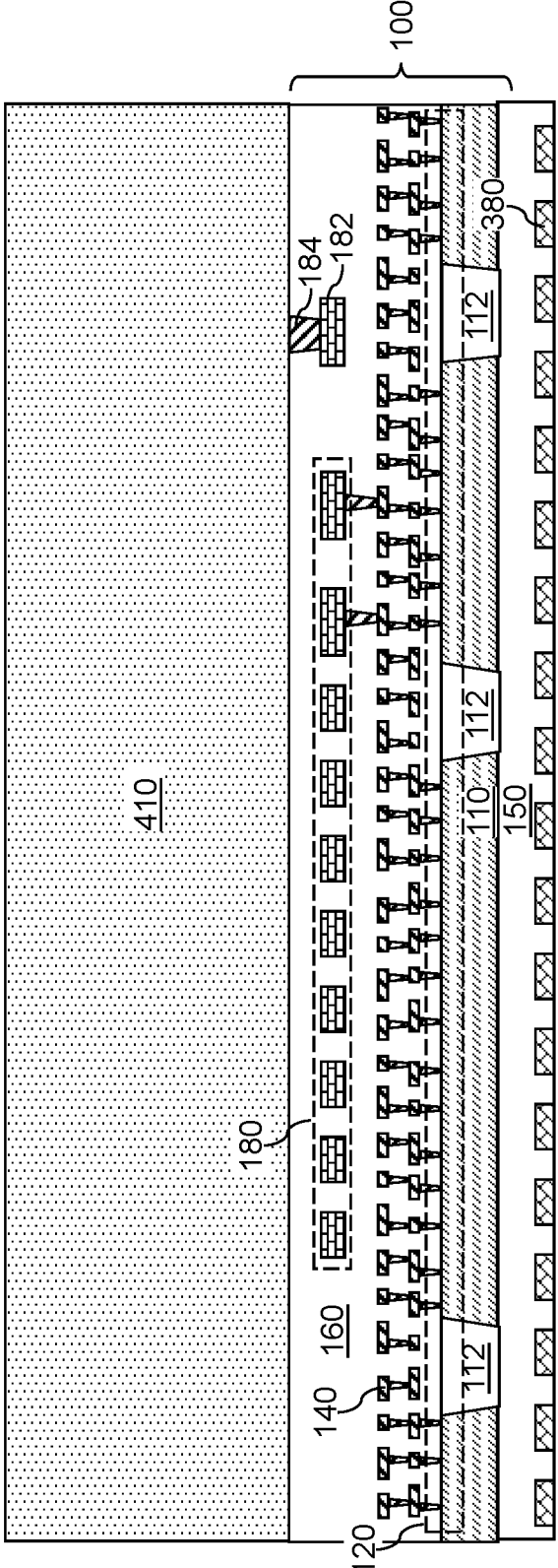
FIG. 4A is a vertical cross-sectional view of the first structure after formation of a first insulating layer and a patterned magnetic shielding layer according to the first embodiment of the present disclosure.

Referring to FIGS. 4A-4G, a first insulating layer 150 and a patterned magnetic shielding layer 380 may be formed on the backside of the semiconductor material layer 110. FIG. 4A is a vertical cross-sectional view of the first structure after formation of the first insulating layer 150 and the patterned magnetic shielding layer 380 according to the first embodiment of the present disclosure. FIGS. 4B-4G are bottom-up views of various configurations of the first structure of FIG. 4A.

For example, the combination of the carrier substrate 410 and the first assembly may be located into a process chamber, and an insulating material deposition process may be performed to deposit the first insulating layer 150 on the physically exposed backside surface of the semiconductor material layer 110. The first insulating layer 150 comprises, and/or consists essentially of, a first insulating material that may be bonded to another insulating material in a thermocompression dielectric-to-dielectric bonding process. As used herein, a dielectric-to-dielectric bonding process refers to a bonding process in which a first dielectric surface is bonded to a second dielectric surface. As used herein, a thermocompression dielectric-to-dielectric bonding process refers to a dielectric-to-dielectric bonding process that uses thermocompression, i.e., compression between the first dielectric surface and the second dielectric surface at an elevated temperature, which may be in a range from 100 degrees Celsius to 400 degrees Celsius, although lesser and greater thicknesses may also be used.

In one embodiment the first insulating material of the first insulating layer 150 may comprise a silicon-oxide material such as undoped silicate glass formed by thermal decomposition and/or plasma-assisted decomposition of tetraethylorthosilicate (TEOS). A thermal anneal process may optionally performed to reduce the residual hydrogen content of a TEOS-derived silicon-oxide material. Such TEOS-derived silicon-oxide materials may comprise residual carbon atoms at an atomic concentration in a range from 10 parts per million to 5,000 parts per million, such as from 100 parts per million to 2,000 parts per million. Further, such TEOS-derived silicon-oxide materials after a thermal anneal process may comprise residual hydrogen atoms at an atomic concentration in a range from 1000 parts per million to 80,000 parts per million, such as from 3,000 parts per million to 50,000 parts per million. Thus, unlike thermal silicon oxide, a TEOS-derived silicon-oxide material includes a relatively high level of residual carbon atoms and residual hydrogen atoms.

The first insulating material of the first insulating layer 150 may be deposited by chemical vapor deposition such as plasma-enhanced chemical vapor deposition or low-pressure chemical vapor deposition. The thickness of the first insulating layer 150 may be in a range from 50 nm to 8,000 nm, such as from 300 nm to 3,000 nm, although lesser and greater thicknesses may also be used.

In one embodiment, the patterned magnetic shielding layer 380 may be formed in an upper portion of the first insulating layer 150. For example, a photoresist layer (not shown) may be deposited over the first insulating layer 150, and may be lithographically patterned to form at least one opening therethrough. An etch process, such as an anisotropic etch process or an isotropic etch process, may be performed to form cavities in an upper portion of the first insulating layer 150. The cavities in the first insulating layer

150 have a depth that does not exceed the thickness of the first insulating layer 150. In one embodiment, the depth of the cavities in the first insulating layer 150 may be less than the thickness of the first insulating layer. The photoresist layer may be subsequently removed, for example, by ashing. A ferromagnetic material having relative permeability of at least 20 may be deposited in the cavities in the first insulating layer 150. Examples of ferromagnetic materials having relative permeability of at least 20 comprise Fe, Co, Ni, NiFe, CoFe, NiCo, NiCoFe, CoZrTa, etc. Generally, any ferromagnetic metallic material having relative permeability of at least 20 may be used. Excess portions of the ferromagnetic material may be removed from above the horizontal plane including the top surface of the first insulating layer 150. Remaining portions of the ferromagnetic material filling the cavities constitute the patterned magnetic shielding layer 380.

In an alternative embodiment, the patterned magnetic shielding layer 380 may be formed by depositing a blank (unpatterned) layer of the ferromagnetic material, by applying and patterning a photoresist layer, and by patterning the blank layer of the ferromagnetic material by performing an etch process that removes unmasked portions of the blank layer of the ferromagnetic material. The etch process may comprise an isotropic etch process or an anisotropic etch process. The photoresist layer may be subsequently removed, for example, by ashing. An additional insulating material, such as an additional TEOS-based silicon-oxide material, may be deposited over the patterned magnetic shielding layer 380, and a planarization process such as a chemical mechanical polishing process may be performed to provide a horizontal top surface to the deposited additional insulating material. The remaining portion of the deposited additional insulating material is incorporated into the first insulating layer 150. In embodiments in which horizontal surfaces of the patterned magnetic shielding layer 380 are physically exposed, such horizontal surfaces may be coplanar with a horizontal surface of the first insulating layer 150. Alternatively, the patterned magnetic shielding layer 380 may be covered by the first insulating layer 150.

The total thickness of the first insulating layer 150 may be in a range from 50 nm to 8,000 nm, such as from 300 nm to 3,000 nm, although lesser and greater thicknesses may also be used. The thickness of the patterned magnetic shielding layer 380 may be in a range from 40 nm to 5,000 nm, such as from 200 nm to 2,000 nm, although lesser and greater thicknesses may also be used. The patterned magnetic shielding layer 380 is subsequently used to prevent formation of eddy current on one side of the patterned magnetic shielding layer 380 by an electromagnetic field generated at another side of the patterned magnetic shielding layer 380. Thus, reduction in the inductor magnetic filed through inductive coupling between the inductor structure 180 and any structure located on an opposite side of the patterned magnetic shielding layer 380 may be reduced, and the Q-factor of the antenna circuit to be formed may be increased. Further, the patterned magnetic shielding layer 380 is electrically conductive, and thus, is subsequently used to prevent capacitive coupling of radio-frequency components located on opposite sides of the patterned magnetic shielding layer 380.

Generally, the patterned magnetic shielding layer 380 may have any pattern provided that the patterned magnetic shielding layer 380 provides an overall areal coverage of at least 10%, and preferably more than 30%, and even more preferably at least 50% within relevant device areas, i.e., areas in which radio-frequency devices generate radio-frequency signals such as areas underlying the inductor structure 180. In one embodiment, the patterned magnetic shielding layer 380 may provide an overall areal coverage of at least 10%, and preferably more than 30%, and even more preferably at least 50% in all areas. Various embodiment configurations and/or patterns for the patterned magnetic shielding layer 380 are illustrated in FIGS. 4B-4G, which are by no means limiting. Generally, any configuration and/or pattern for the patterned magnetic shielding layer 380 may be used as long as radio-frequency signals may be effectively blocked in relevant device areas.

Figure 4B:
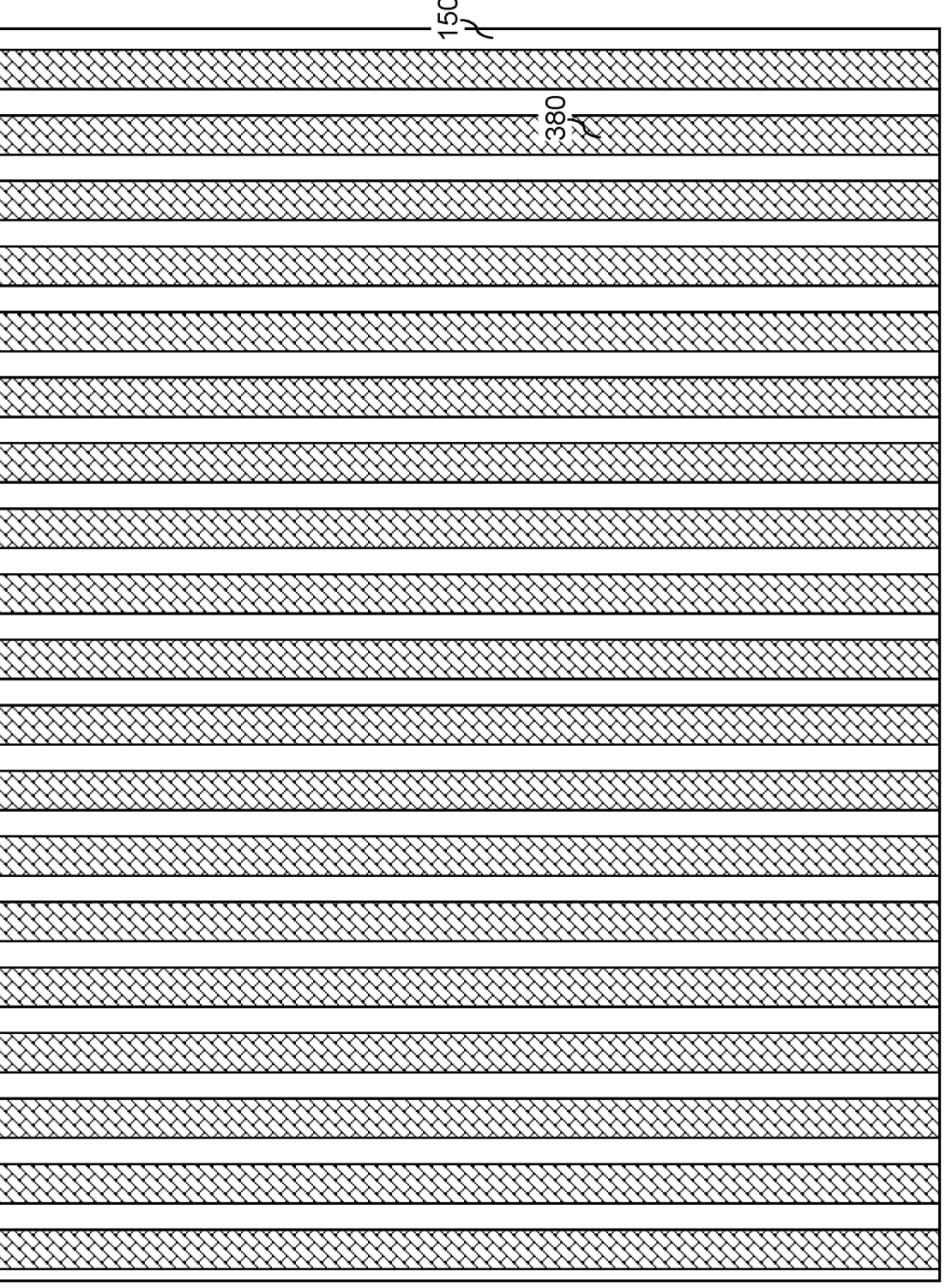
FIGS. 4B-4G are bottom-up views of various configurations of the first structure of FIG. 4A.
Figure 4C:
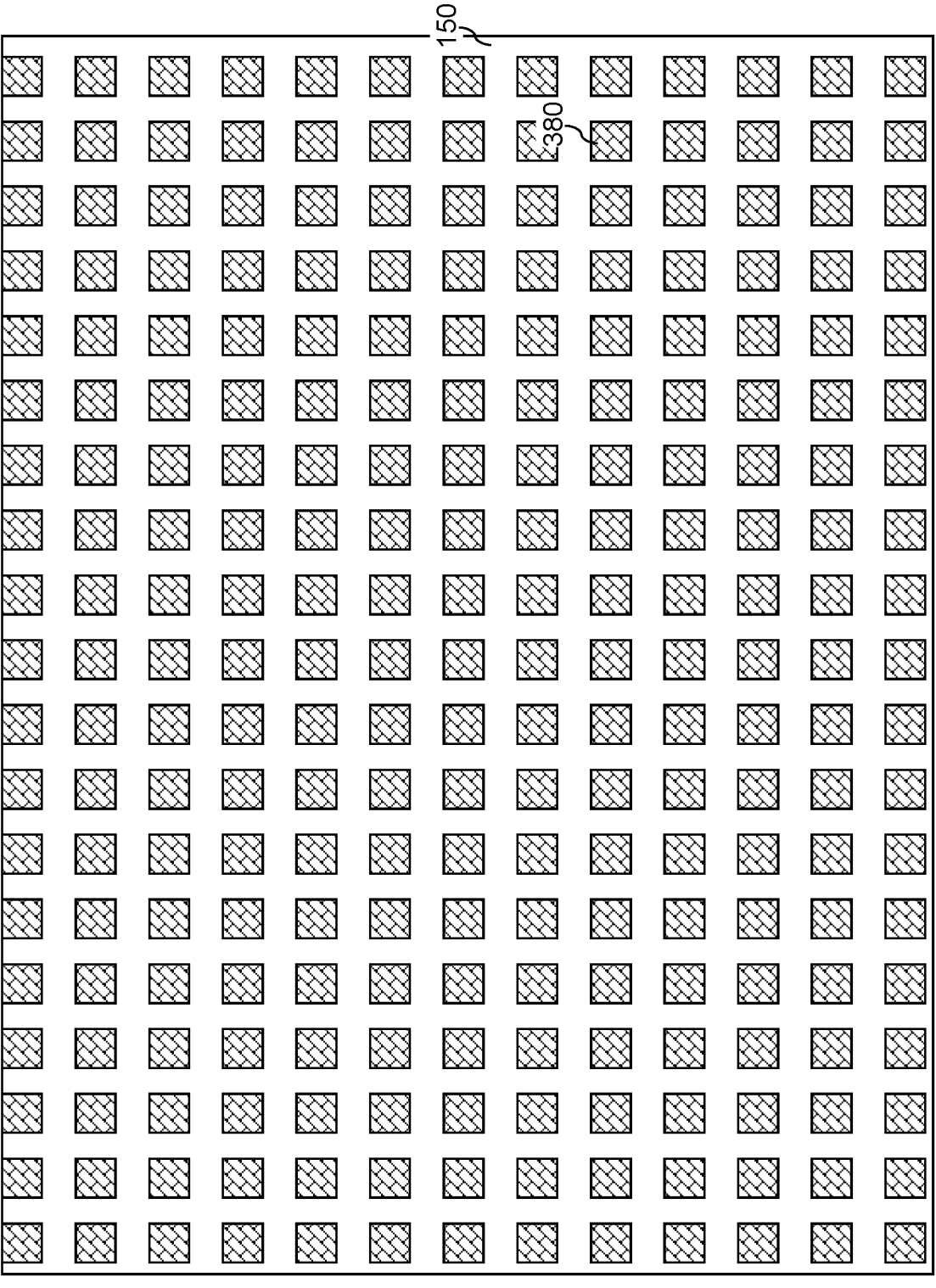
Figure 4D:
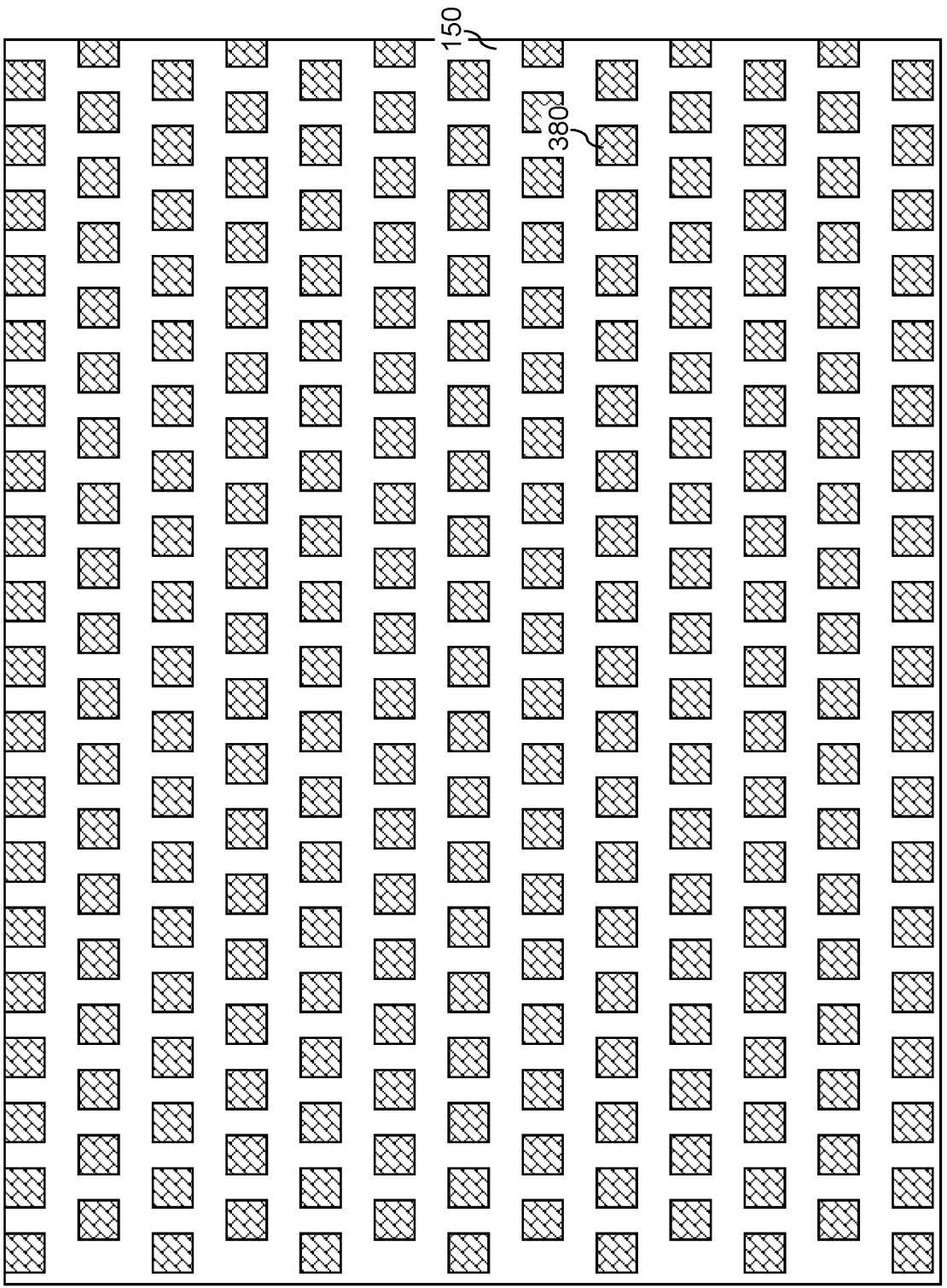
Figure 4E:
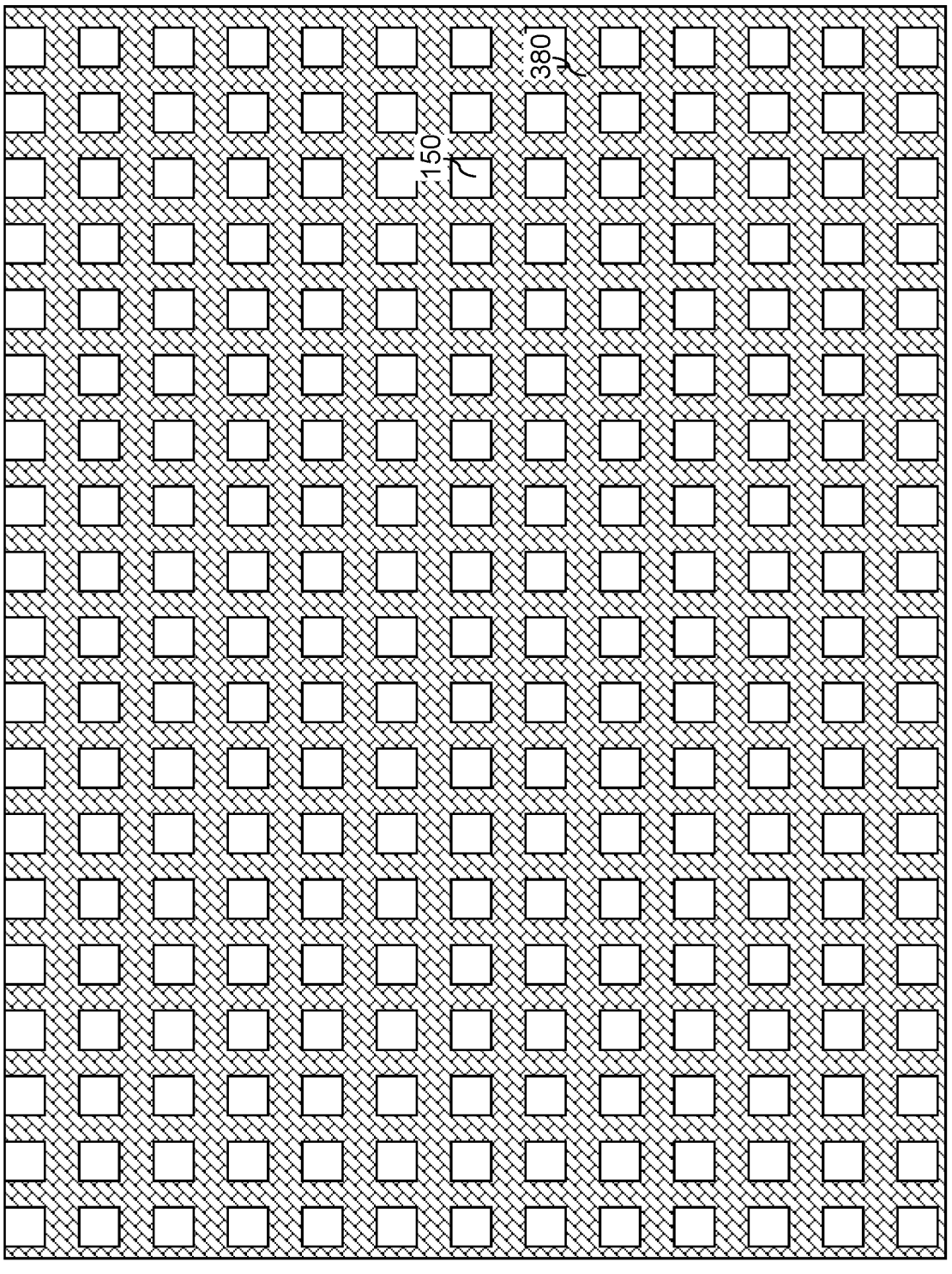
Figure 4F:
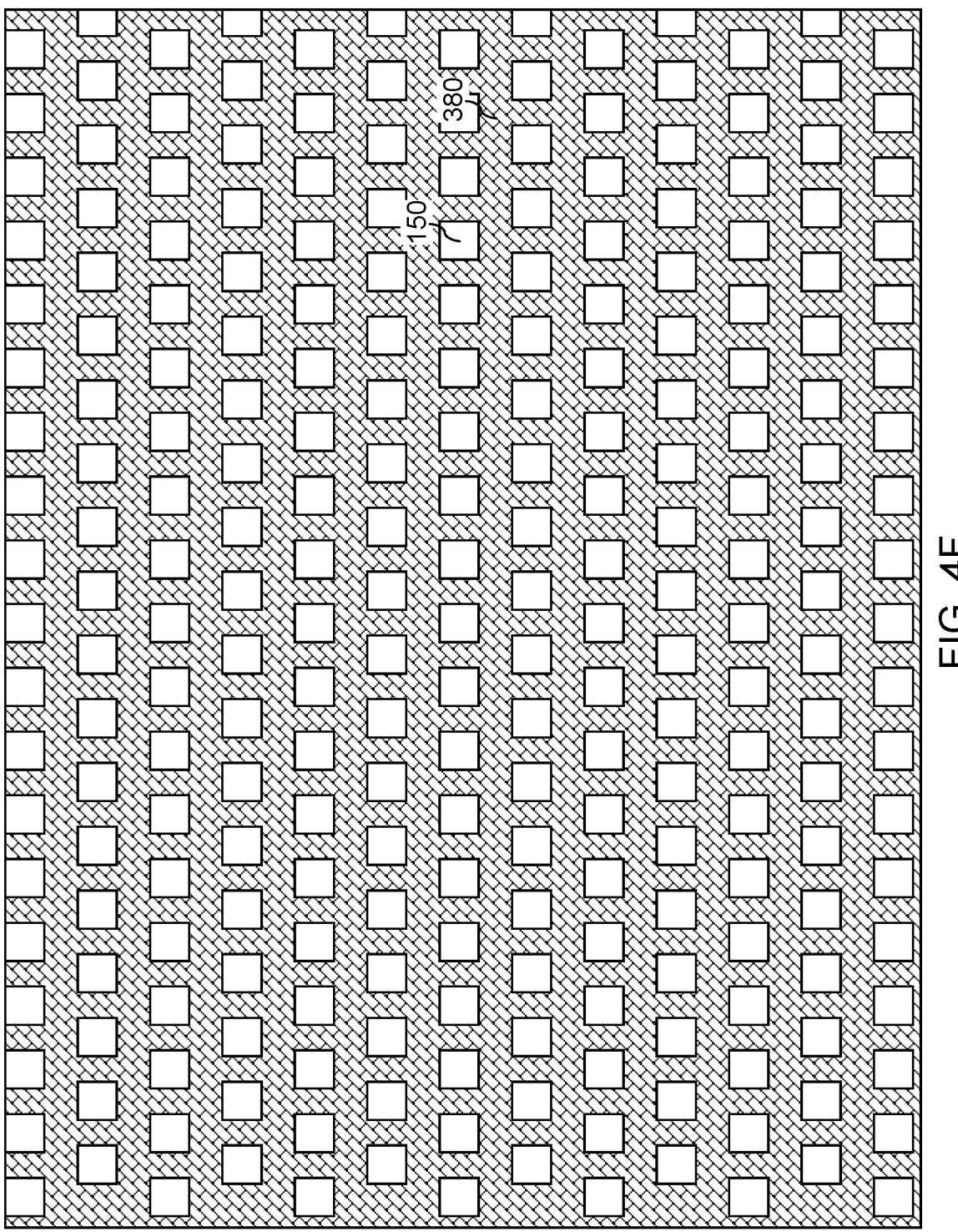
Figure 4G:
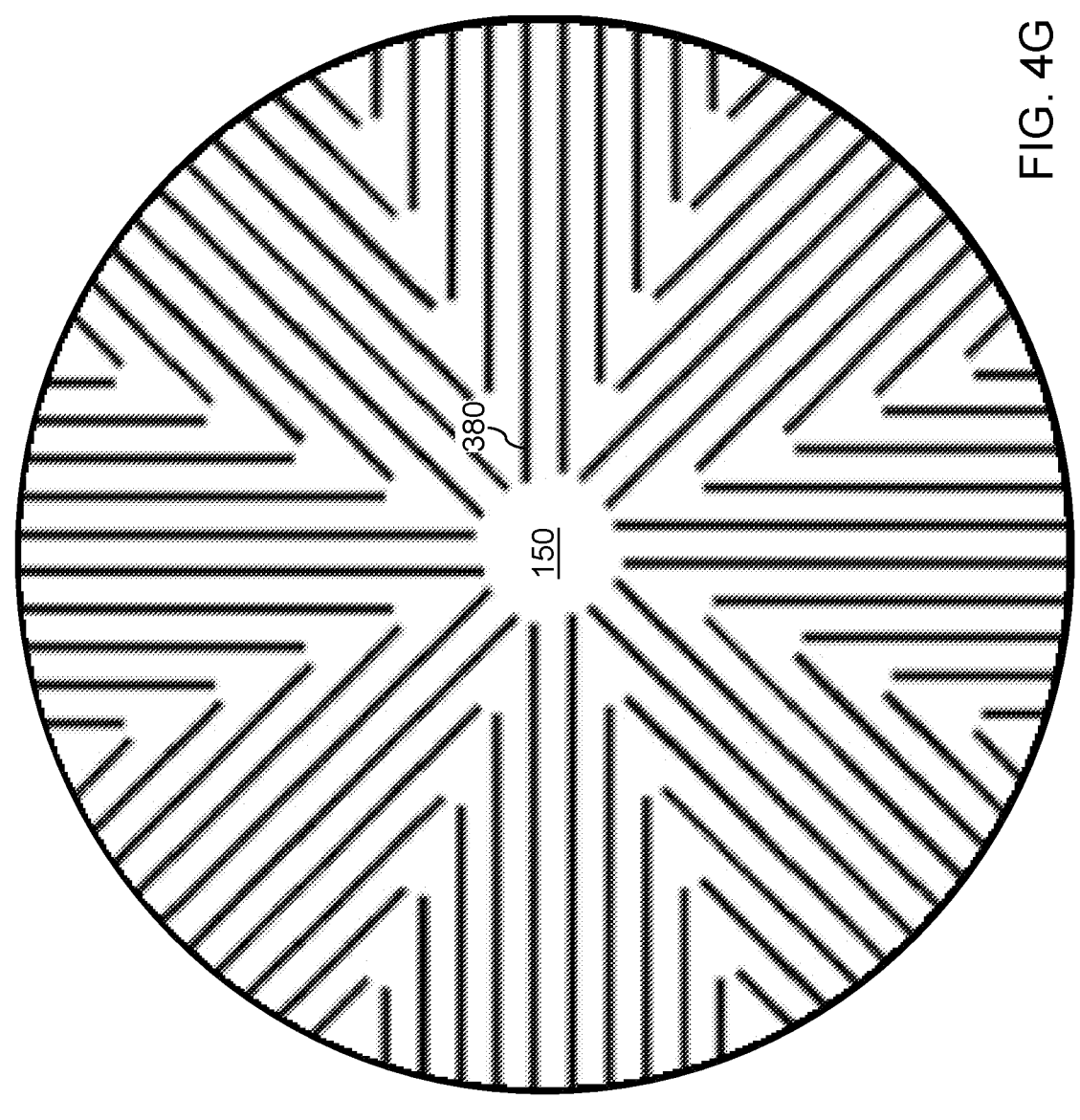

FIG. 4B illustrates a configuration in which the patterned magnetic shielding layer 380 includes a plurality of metal lines arranged in a one-dimensional line-and-space pattern. FIG. 4C illustrates a configuration in which the patterned magnetic shielding layer 380 includes a two-dimensional array of metal plates. FIG. 4D illustrates another configuration in which the patterned magnetic shielding layer 380 includes a two-dimensional array of metal plates. FIG. 4E illustrates a configuration in which the patterned magnetic shielding layer 380 comprises a continuous metallic plate including a plurality of openings filled with portions of the first insulating layer 150. FIG. 4F illustrates another configuration in which the patterned magnetic shielding layer 380 comprises a continuous metallic plate including a plurality of openings filled with portions of the first insulating layer 150. FIG. 4G illustrated a configuration in which metal lines including a ferromagnetic material are arranged along generally radial directions for each semiconductor die.

Generally, the lateral dimension of gaps between neighboring portions of the patterned magnetic shielding layer 380 is not greater than the wavelength of radio-frequency signals to be used in the inductor structure 180. For example, in instances in which the radio-frequency circuit is designed for operation at 30 GHz that generates electromagnetic radiation at 1 mm wavelength, the lateral dimension of gaps between neighboring portions of the patterned magnetic shielding layer 380 may be less than 1 mm, and preferably less than 0.2 mm. In instances in which the radio-frequency circuit is designed for operation at 6 GHz that generates electromagnetic radiation at 5 mm wavelength, the lateral dimension of gaps between neighboring portions of the patterned magnetic shielding layer 380 may be less than 5 mm, and preferably less than 1 mm. In instances in which If the radio-frequency circuit is designed for operation at 100 GHz that generates electromagnetic radiation at 0.3 mm wavelength, the lateral dimension of gaps between neighboring portions of the patterned magnetic shielding layer 380 may be less than 0.3 mm, and preferably less than 0.1 mm.

In some embodiment, the patterned magnetic shielding layer 380 is formed in a second insulating layer that is formed on a second semiconductor substrate to be subsequently provided. In this embodiment, the processing steps for formation of the patterned magnetic shielding layer 380 in the first insulating layer 150 may be omitted.

Figure 5:
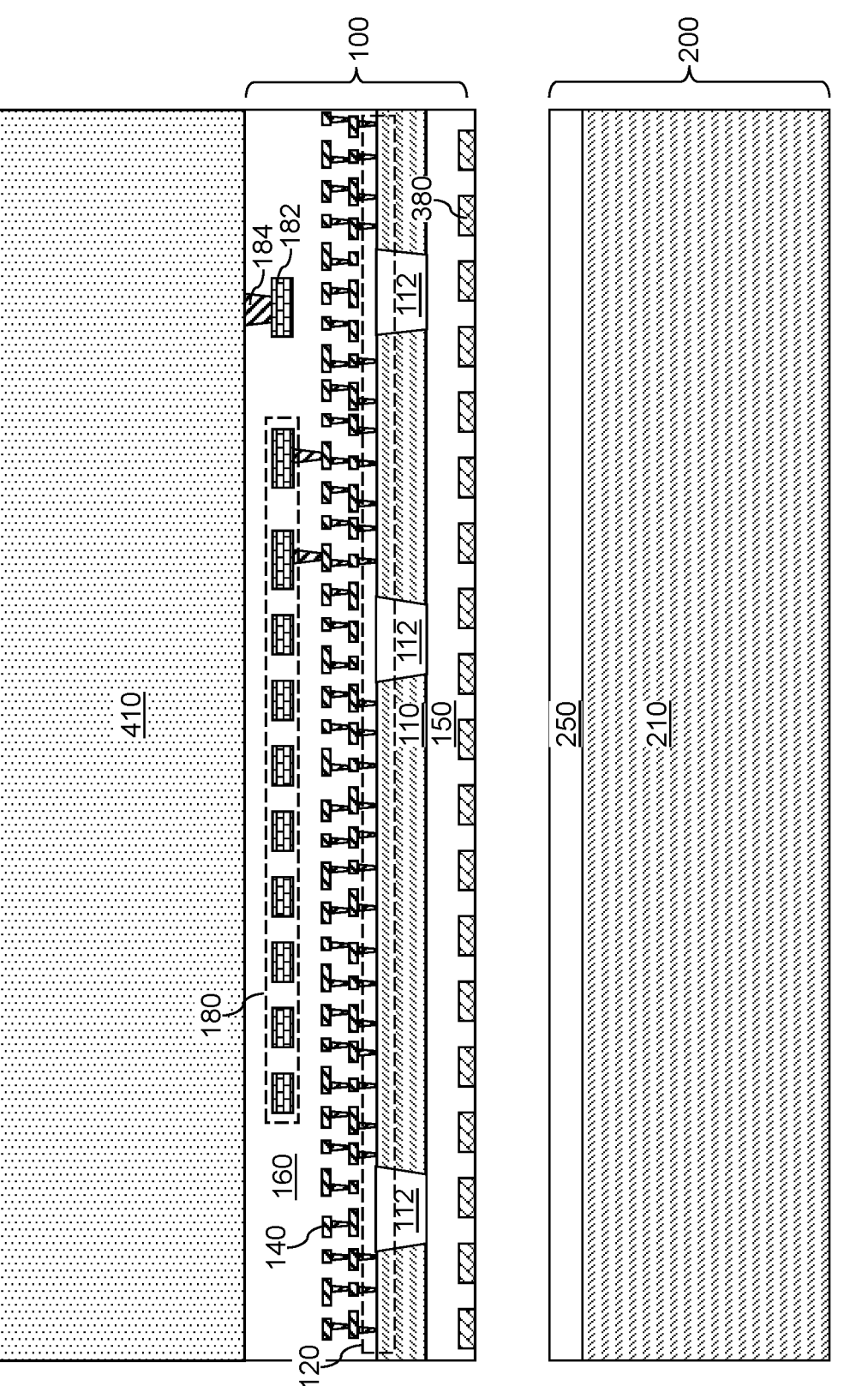
FIG. 5 is a vertical cross-sectional view of the first structure after providing a handle substrate and a second insulating layer according to the first embodiment of the present disclosure.

Referring to FIG. 5, a second assembly 200 including a handle substrate 210 and a second insulating layer 250 comprising a second insulating material is provided. The handle substrate 210 comprises a second semiconductor substrate. In one embodiment, the second semiconductor substrate (comprising the handle substrate 210) comprises a single crystalline silicon substrate having direct-current resistivity in a range from 1.0 Ω-cm to 3.0×10⁴ Ω-cm, and has a thickness in a range from 100 microns to 2 mm. Generally, high resistivity is desirable for the second semiconductor substrate because a high-resistivity semiconductor material provides less coupling with electromagnetic waves that are generated by passive devices such as the inductor structure 180. Other commercially available single crystalline silicon substrates may provide direct-current resistivity in a range from 1.0 Ω-cm to 3.0×10⁴ Ω-cm. Special high-resistivity single crystalline silicon substrate may provide direct-current resistivity in a range from 1.0 Ω-cm to 3.0×10⁴ Ω-cm, albeit at a higher cost. In one embodiment, single crystalline silicon having relatively high resistivity may be used to reduce the production cost without meaningful impact to the performance of the radio-frequency devices selected from the semiconductor devices 120. Alternatively, single crystalline silicon having very high resistivity may be used to provide the highest-level radio-frequency performance (such as a very high Q-factor) and to provide high performance of the radio-frequency devices selected from the semiconductor devices 120 at an increased production cost. Generally, selection of the resistivity of the second semiconductor substrate may be made as needed based on desired device performance parameters and economic considerations. The thickness of the second semiconductor substrate is sufficient to provide structural support to itself and to additional material portions to be formed thereupon. For example, the second semiconductor substrate may have a thickness in a range from 100 microns to 2 mm, such as from 500 microns to 1 mm.

A second insulating layer 250 may be formed on one side of the handle substrate 210. The second insulating layer 250 comprises, and/or consists essentially of, a second insulating material that may be bonded to another insulating material in a thermocompression dielectric-to-dielectric bonding process. In one embodiment the second insulating material of the second insulating layer 250 may comprise a silicon-oxide material such as undoped silicate glass formed by thermal decomposition and/or plasma-assisted decomposition of tetraethylorthosilicate (TEOS). A thermal anneal process may optionally performed to reduce the residual hydrogen content of a TEOS-derived silicon-oxide material. The second insulating layer 250 may have the same material composition as, or may have a material composition that is different from, the first insulating material. The second insulating material of the second insulating layer 250 may be deposited by chemical vapor deposition such as plasma-enhanced chemical vapor deposition or low-pressure chemical vapor deposition. The thickness of the second insulating layer 250 may be in a range from 50 nm to 8,000 nm, such as from 300 nm to 3,000 nm, although lesser and greater thicknesses may also be used. The sum of the thickness of the first insulating layer 150 and the thickness of the second insulating layer 250 may be in a range from 100 nm to 10,000 nm, such as from 500 nm to 5,000 nm, although lesser and greater thicknesses may also be used.

In embodiments in which the patterned magnetic shielding layer 380 is formed within the first insulating layer 150, formation of another patterned magnetic shielding layer in the second insulating layer 250 is optional, and may be omitted. In embodiments in which the patterned magnetic shielding layer is not formed within the first insulating layer 150, a patterned magnetic shielding layer 380 may be formed in the second insulating layer 250. Generally, one of the first insulating layer 150 and the second insulating layer 250 embeds a patterned magnetic shielding layer 380 comprising at least one portion of a ferromagnetic material having relative permeability of at least 20.

Figure 6:
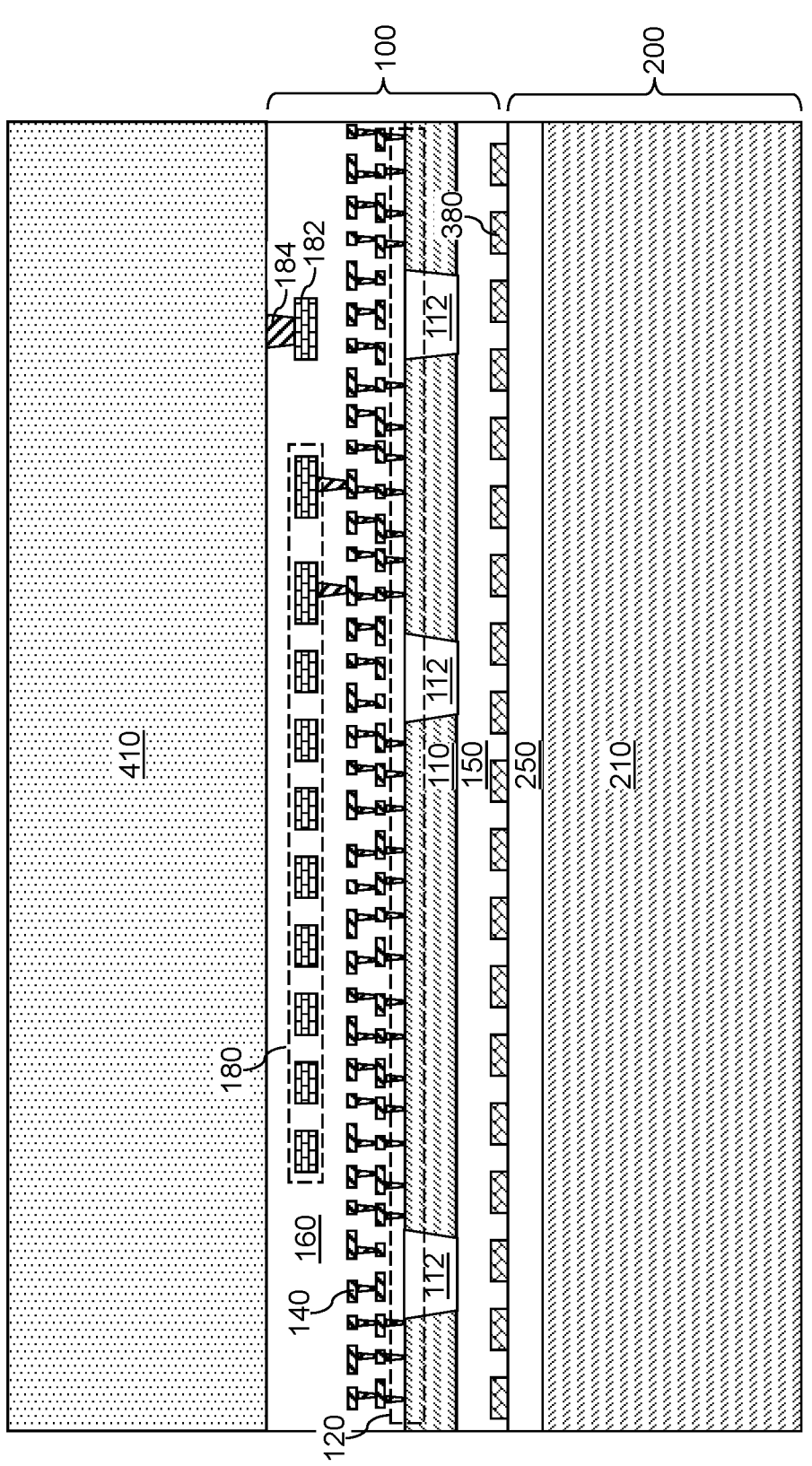
FIG. 6 is a vertical cross-sectional view of the first structure after bonding the second insulating layer to the first insulating layer according to the first embodiment of the present disclosure.

Referring to FIG. 6, the first assembly 100 and the second assembly 200 are brought into contact with each other such that the first insulating layer 150 contacts the second insulating layer 250. A thermocompression dielectric-to-dielectric bonding process may be performed to bond the first insulating layer 150 with the second insulating layer 250. For example, in instances in which the first insulating layer 150 and the second insulating layer 250 comprise silicon oxide materials such as TEOS-based silicon-oxide materials, the thermocompression dielectric-to-dielectric bonding process may comprise an oxide-to-oxide bonding process performed at an elevated temperature in a range from 100 degrees Celsius to 350 degrees Celsius, such as from 150 degrees Celsius to 250 degrees Celsius.

The first structure after the processing steps of FIG. 6 may comprise a handle substrate 210; a patterned magnetic shielding layer 380 comprising at least one portion of a ferromagnetic material having relative permeability of at least 20 and located over the handle substrate 210; a semiconductor material layer 110 overlying the patterned magnetic shielding layer 380; semiconductor devices 120 located on the semiconductor material layer 110; metal interconnect structures 140 embedded within dielectric material layers 160 and electrically connected to the semiconductor devices 120; and an inductor structure 180 embedded within the dielectric material layers 160.

At least one insulating layer (150, 250) may be provided, which embeds the patterned magnetic shielding layer 380 and is located between the handle substrate 210 and the semiconductor material layer 110. In one embodiment, the at least one insulating layer (150, 250) comprises: a first insulating layer 150 underlying the semiconductor material layer 110 and comprising a first insulating material; and a second insulating layer 250 underlying the first insulating layer 150 and comprising a second insulating material that is bonded to the first insulating material. In embodiments in which one of the first insulating layer 150 and the second insulating layer 250 is omitted, the patterned magnetic shielding layer 380 may be embedded in the other of the first insulating layer 150 and the second insulating layer 250 such that the patterned magnetic shielding layer 380 is vertically spaced from each of the semiconductor material layer 110 and the handle substrate 210.

In one embodiment, the first insulating material comprises a first silicon oxide material; and the second insulating material comprises a second silicon oxide material. In one embodiment, the patterned magnetic shielding layer 380 is in contact with the first insulating layer 150 and with the second insulating layer 250. In one embodiment, the patterned magnetic shielding layer 380 comprises first horizontal surfaces that are proximal to the semiconductor material layer 110 and second horizontal surfaces that are proximal to the handle substrate 210 and vertically spaced from the first horizontal surfaces by a thickness of the patterned magnetic shielding layer 380; and the first horizontal surfaces are located within a same horizontal plane as bonding interfaces between the first insulating layer 150 and the second insulating layer 250.

In one embodiment, the patterned magnetic shielding layer 380 comprises a plurality of discrete patterned magnetic shielding material portions having a same vertical thickness and laterally spaced from one another and not in direct contact with one another (for example, as illustrated in configurations of FIGS. 4B, 4C, and 4D). In one embodiment, the patterned magnetic shielding layer 380 comprise a continuous magnetic shielding material layer including a plurality of openings therethrough; and insulating material portions (which may be portions of the first insulating layer 150 or the second insulating layer 250) are located in each of the plurality of openings in the continuous magnetic shielding material layer (for example, as illustrated in configurations of FIGS. 4E and 4F).

Figure 7:
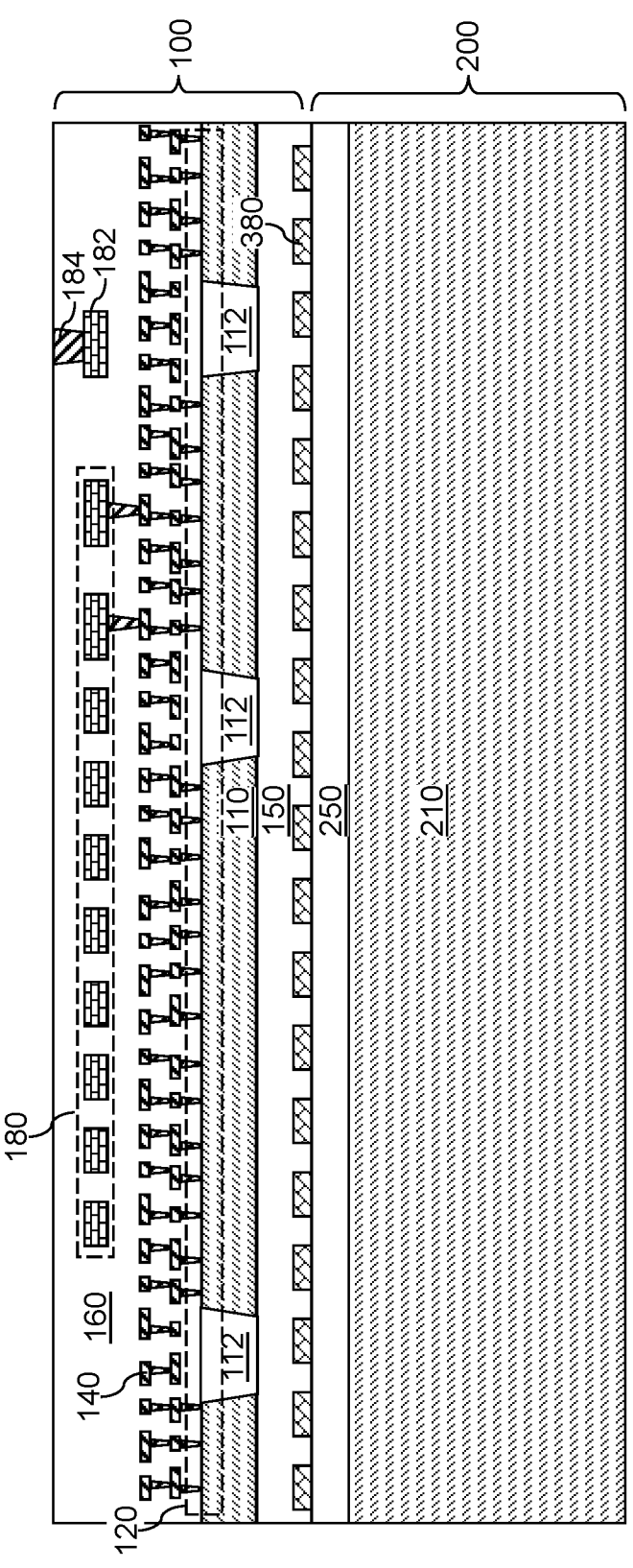
FIG. 7 is a vertical cross-sectional view of the first structure after detaching the carrier substrate according to the first embodiment of the present disclosure.

Referring to FIG. 7, the carrier substrate 410 may be detached from the bonded structure including the first assembly 100 and the second assembly 200. The adhesive layer (not shown) between the first assembly 100 and the carrier substrate 410 may be decomposed thermally in embodiments in which the adhesive layer comprises a thermally-decomposable adhesive material, or by irradiation of ultraviolet radiation through the carrier substrate 410 in case the adhesive layer comprises an ultraviolet-decomposable adhesive material. A suitable clean process may be performed to remove any residual material on the surface of the dielectric material layers 160.

Figure 8:
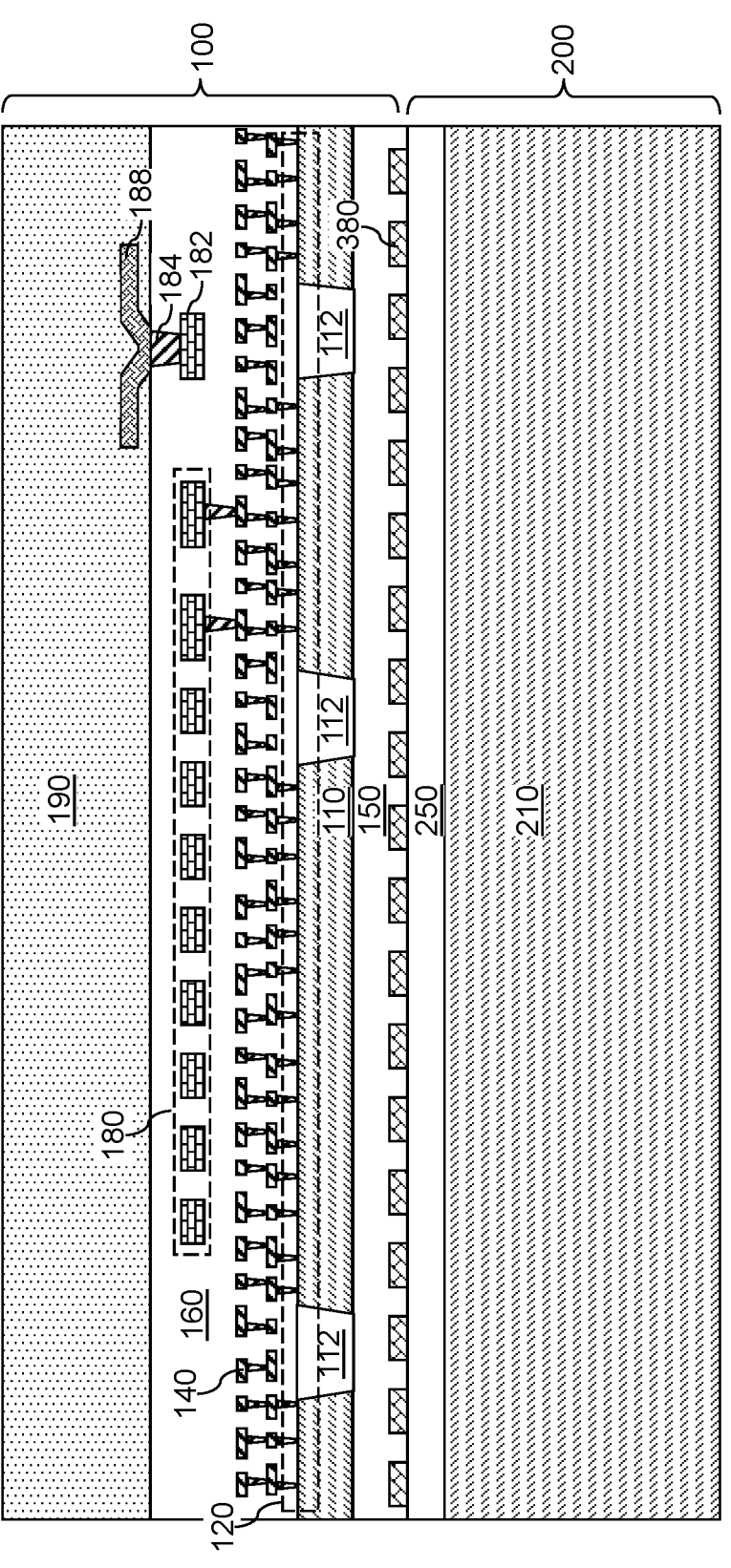
FIG. 8 is a vertical cross-sectional view of the first structure after formation of a radio-frequency antenna and a molding compound layer according to the first embodiment of the present disclosure.

Referring to FIG. 8, a radio-frequency antenna 188 may be formed on the antenna connection structures (182, 184). Any radio-frequency antenna known in the art may be used for the radio-frequency antenna 188 of the present disclosure. A molding compound layer 190 may be optionally formed over the radio-frequency antenna 188. The molding compound layer 190 provides mechanical protection to the radio-frequency antenna 188. The thickness of the molding compound layer 190 may be in a rang from 10 microns to 1 mm, although lesser and greater thicknesses may also be used.

Generally, the radio-frequency antenna 188 may be formed over the dielectric material layers 160 such that the radio-frequency antenna 188 is electrically connected to the inductor structure 180, a subset of the metal interconnect structures 140, and a subset of the semiconductor devices 120. The patterned magnetic shielding layer 380 may be electrically floating, and may be electrically isolated from the semiconductor material layer 110 and the handle substrate 210.

The first structure comprises semiconductor devices 120 located on a first side of a semiconductor material layer 110; metal interconnect structures 140 embedded within dielectric material layers 160 and electrically connected to the semiconductor devices 120; an inductor structure 180 embedded within the dielectric material layers 160; a handle substrate 210 that underlies the semiconductor material layer 110; and a patterned magnetic shielding layer 380 comprising at least one portion of a ferromagnetic material having relative permeability of at least 20 and located between the semiconductor material layer 110 and the handle substrate 210.

FIGS. 9-13 illustrate alternative configurations of the first structure, which may be derived from the first structure by modifying the structure of the at least one insulating material layer (150, 250) and/or by forming additional metallic structures therein.

Figure 9:
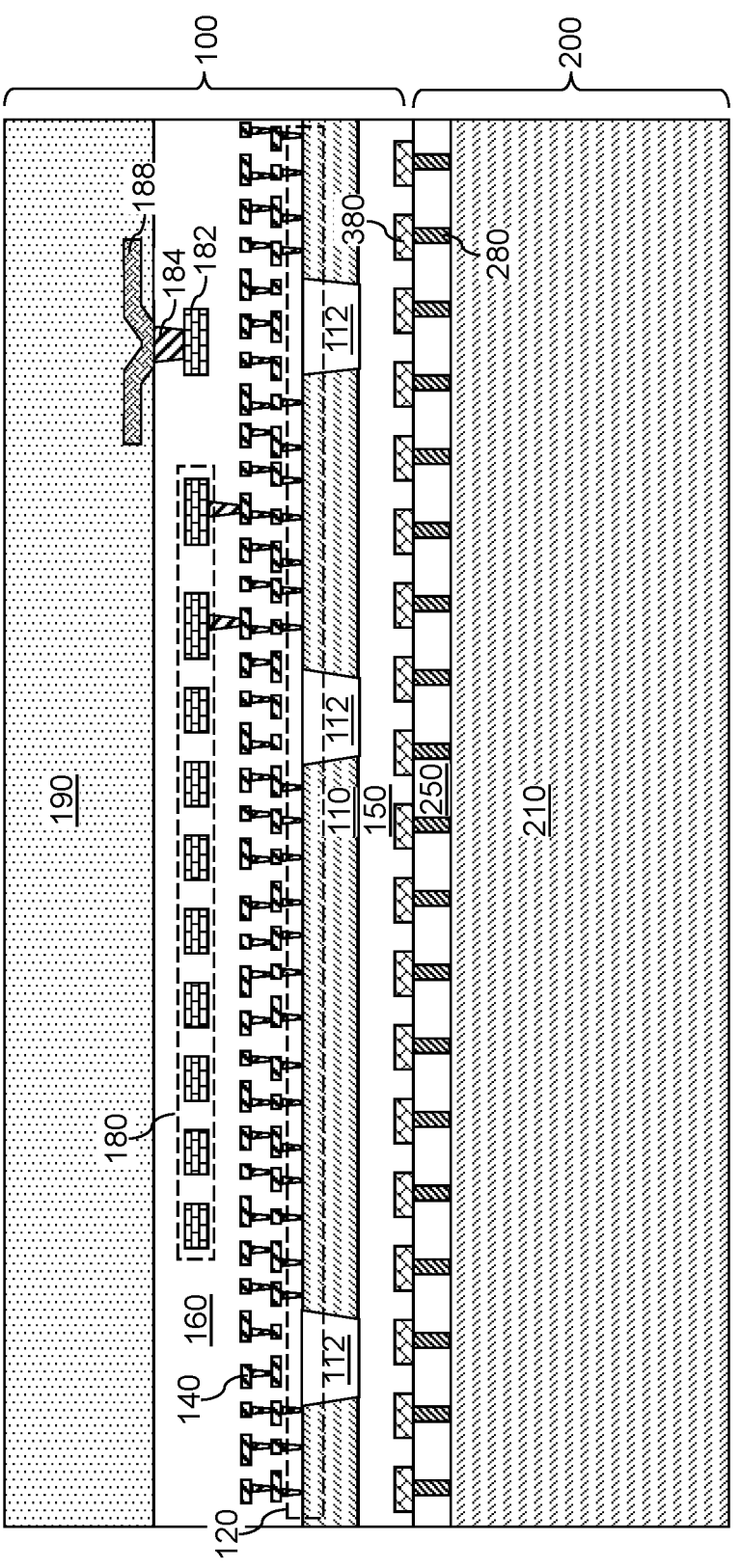
FIG. 9 is a vertical cross-sectional view of a first alternative configuration of the first structure according to the first embodiment of the present disclosure.

Referring to FIG. 9, a first alternative configuration of the first structure may be derived from the first structure by forming conductive via structures 280 through the second insulating layer 250. Upon bonding the first insulating layer 150 and the second insulating layer 250, the conductive via structures 280 contact, and provide electrically conductive paths between, the second semiconductor substrate of the handle substrate 210 and the patterned magnetic shielding layer 380. Thus, each portion of the patterned magnetic shielding layer 380 may be electrically connected to the handle substrate.

Figure 10:
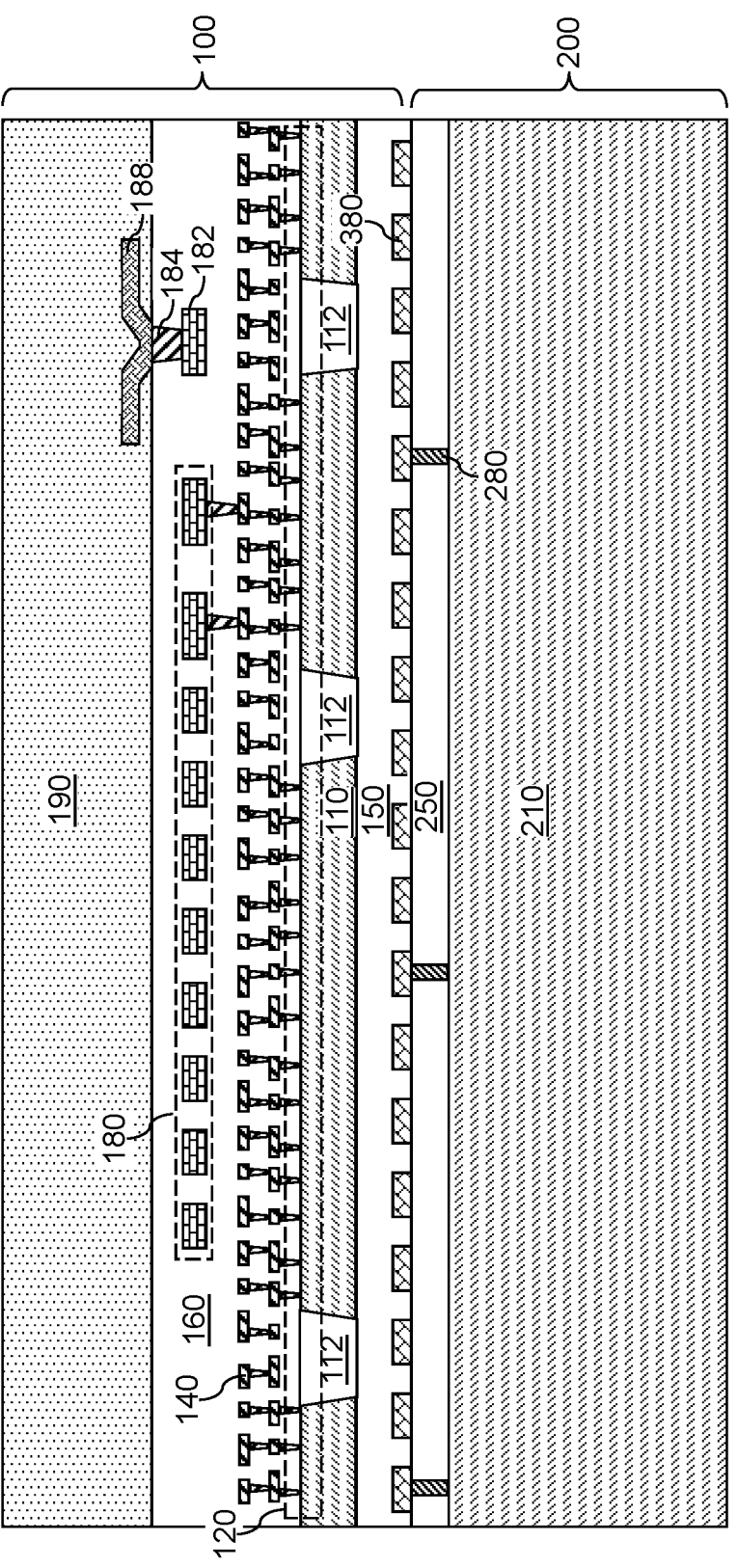
FIG. 10 is a vertical cross-sectional view of a second alternative configuration of the first structure according to the first embodiment of the present disclosure.

Referring to FIG. 10, a second alternative configuration of the first structure may be derived from the first structure by forming conductive via structures 280 through the second insulating layer 250. Upon bonding the first insulating layer 150 and the second insulating layer 250, the conductive via structures 280 contact, and provide electrically conductive paths between, the second semiconductor substrate of the handle substrate 210 and a subset of ferroelectric material portions of the patterned magnetic shielding layer 380. Thus, first portions of the patterned magnetic shielding layer 380 may be electrically connected to the handle substrate, and second portions of the patterned magnetic shielding layer 380 may be electrically floating.

Figure 11:
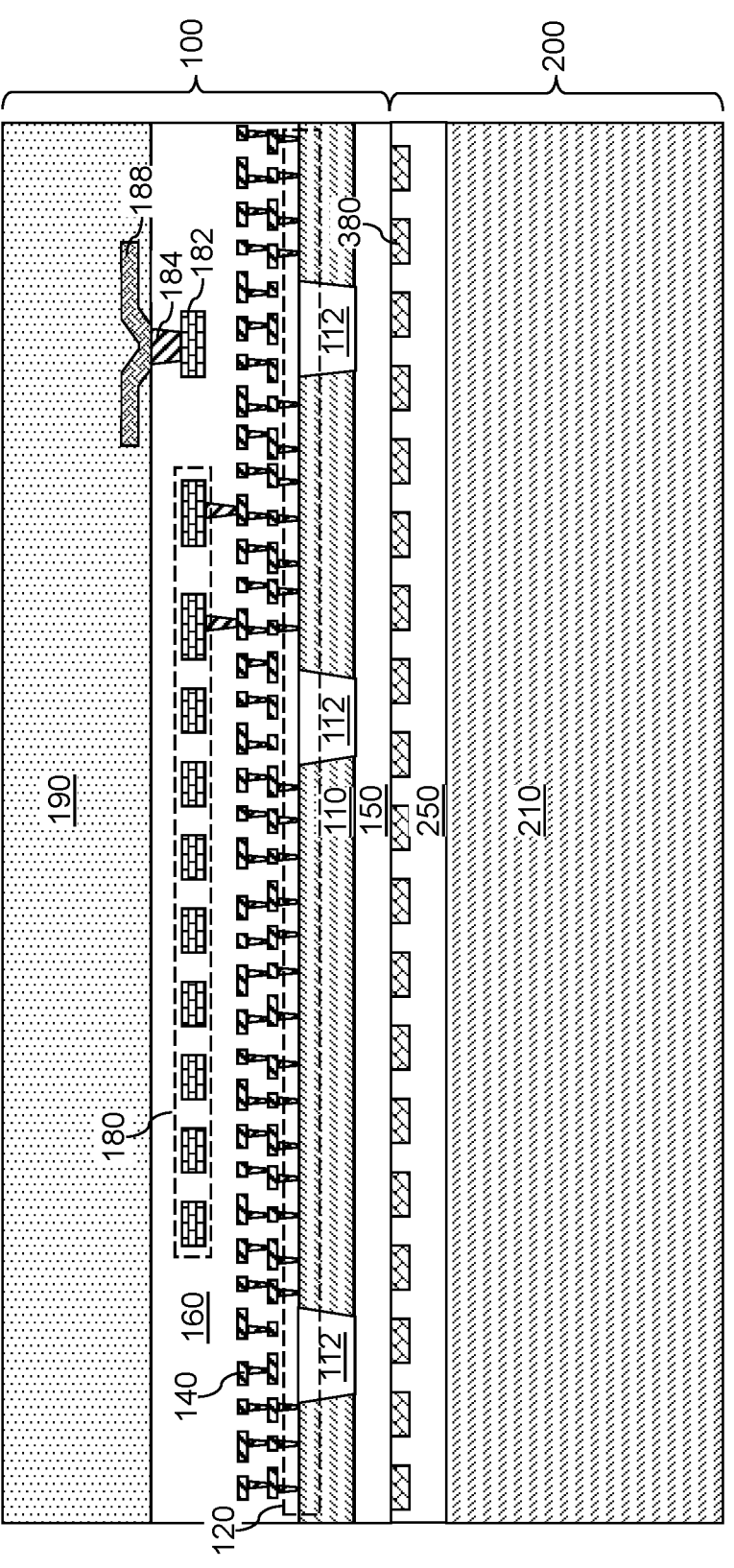
FIG. 11 is a vertical cross-sectional view of a third alternative configuration of the first structure according to the first embodiment of the present disclosure.

Referring to FIG. 11, a third alternative configuration of the first structure may be derived from the first structure by forming the patterned magnetic shielding layer in an upper portion of the second insulating layer 250 rather than in a bottom portion of the second insulating layer 150. In this embodiment, the patterned magnetic shielding layer 380 may be embedded in the second insulating layer 250. In one embodiment, the patterned magnetic shielding layer 380 comprises first horizontal surfaces that are proximal to the semiconductor material layer 110 and second horizontal surfaces that are proximal to the handle substrate 210 and vertically spaced from the first horizontal surfaces by a thickness of the patterned magnetic shielding layer 380; and the first horizontal surfaces are located within a same horizontal plane as bonding interfaces between the first insulating layer 150 and the second insulating layer 250.

Figure 12:
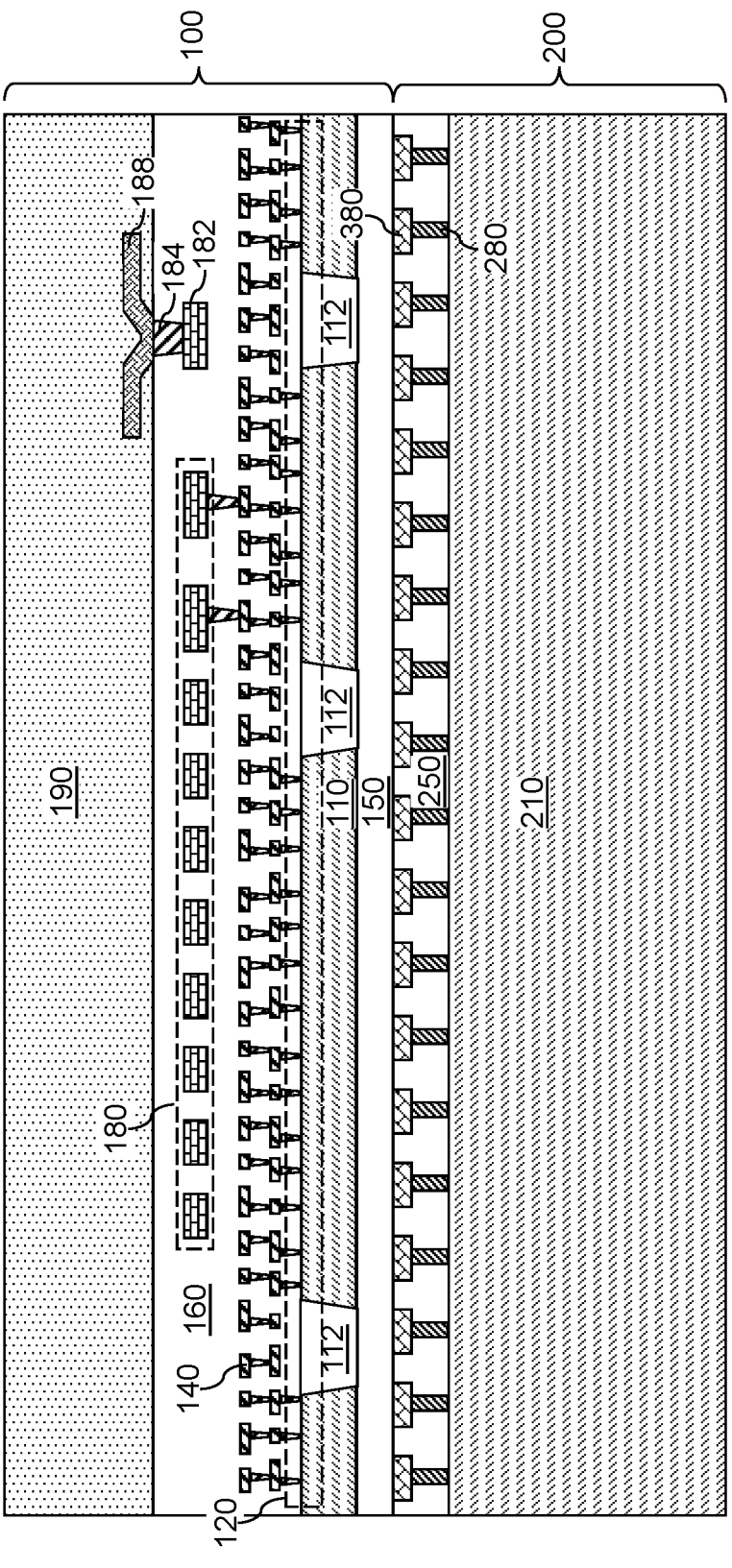
FIG. 12 is a vertical cross-sectional view of a fourth alternative configuration of the first structure according to the first embodiment of the present disclosure.

Referring to FIG. 12, a fourth alternative configuration of the first structure may be derived from the third alternative configuration of the first structure by forming conductive via structures 280 in a lower portion of the second insulating layer 250 prior to formation of the patterned magnetic shielding layer 380 in an upper portion of the second insulating layer 250. The conductive via structures 280 contact, and provide electrically conductive paths between, the second semiconductor substrate of the handle substrate 210 and the patterned magnetic shielding layer 380. Thus, each portion of the patterned magnetic shielding layer 380 may be electrically connected to the handle substrate 210.

Figure 13:
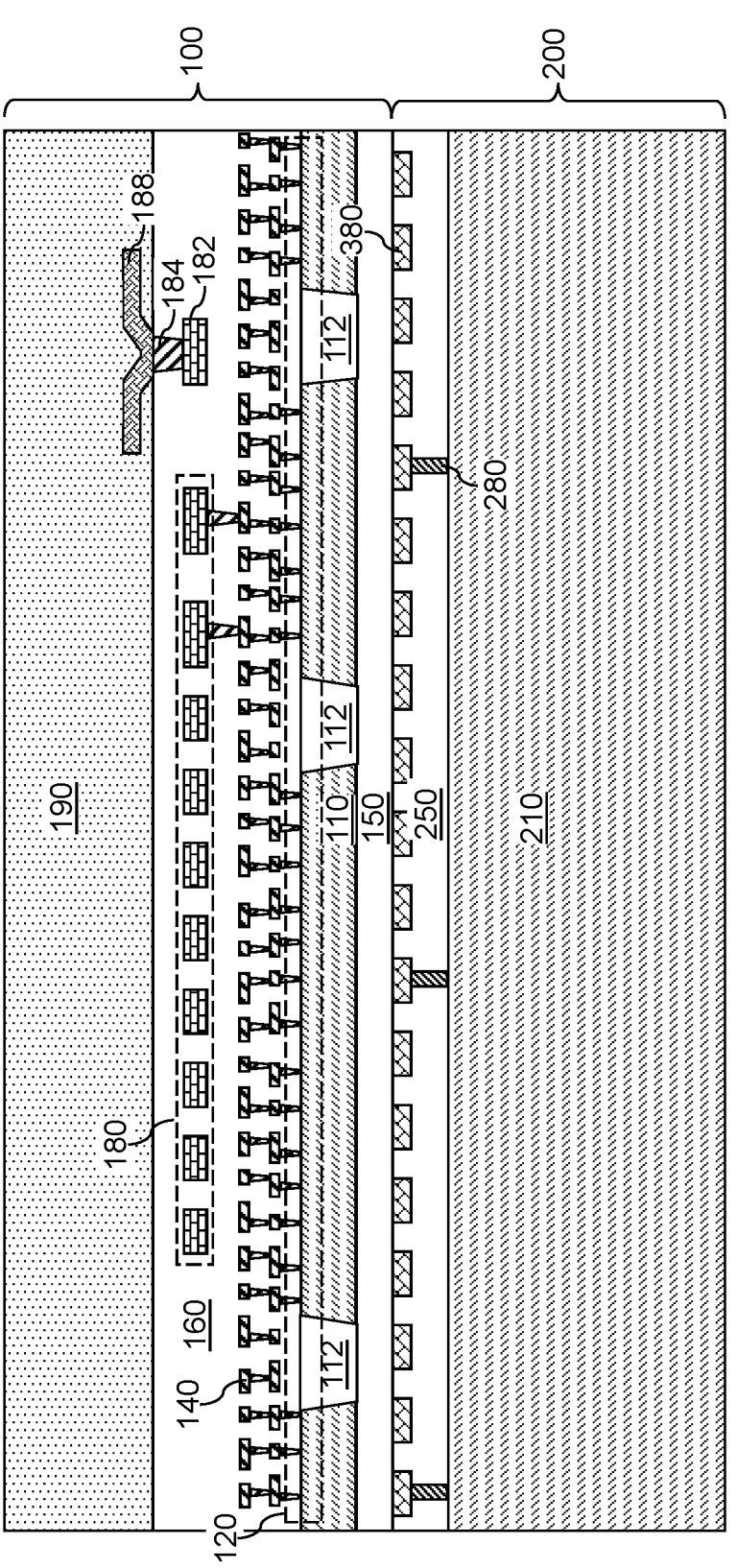
FIG. 13 is a vertical cross-sectional view of a fifth alternative configuration of the first structure according to the first embodiment of the present disclosure.

Referring to FIG. 13, a fifth alternative configuration of the first structure may be derived from the third structure by forming conductive via structures 280 in a lower portion of the second insulating layer 250 prior to formation of the patterned magnetic shielding layer 380 in an upper portion of the second insulating layer 250. The conductive via structures 280 contact, and provide electrically conductive paths between, the second semiconductor substrate of the handle substrate 210 and a subset of ferroelectric material portions of the patterned magnetic shielding layer 380. Thus, first portions of the patterned magnetic shielding layer 380 may be electrically connected to the handle substrate 210, and second portions of the patterned magnetic shielding layer 380 may be electrically floating.

Figure 14:
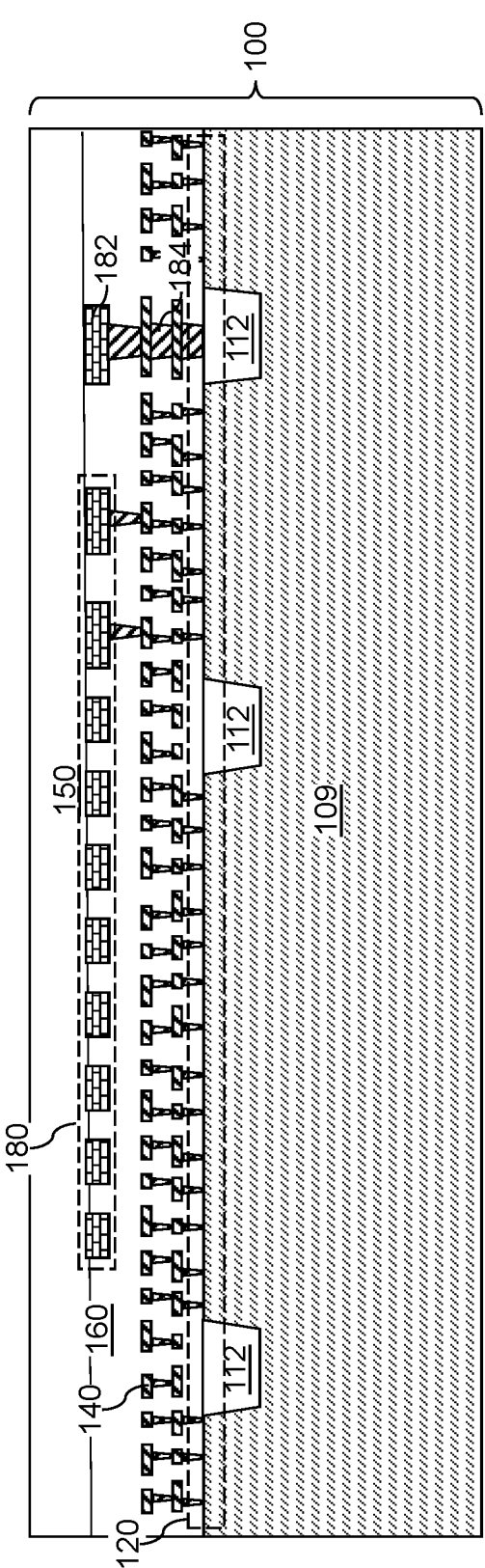
FIG. 14 is a vertical cross-sectional view of a second structure after formation of semiconductor devices, metal interconnect structures, an inductor structure embedded in dielectric material layers, and a first insulating layer over a first semiconductor substrate according to a second embodiment of the present disclosure.

Referring to FIG. 14, a second structure according to a second embodiment of the present disclosure may be derived from the first structure illustrated in FIG. 1 by optionally omitting formation of a portion of the dielectric material layers 160 overlying the inductor structure 180, and by forming the first insulating layer 150 over the inductor structure 180 and the dielectric material layers 160. Alternatively, the second structure may be derived from the first structure illustrated in FIG. 1 by forming the first insulating layer 150 in lieu of the portion of the dielectric material layer 160 that overlies the horizontal plane including the top surface of the inductor structure 180. The first insulating layer 150 may have the same material composition and the same thickness range as disclosed above with respect to the first structure illustrated in FIGS. 1-13.

In this embodiment, the antenna connection structures (182, 184) may be formed as a set of at least one antenna connection metal line 182 and at least one antenna connection via structure 184 that vertically extends from a top surface of a shallow trench isolation structure 112 to a metal interconnect structure located at a same level as the inductor structure 180 and electrically connected to a subset of the semiconductor devices 120 including LNA circuits and power amplification circuits.

Figure 15:
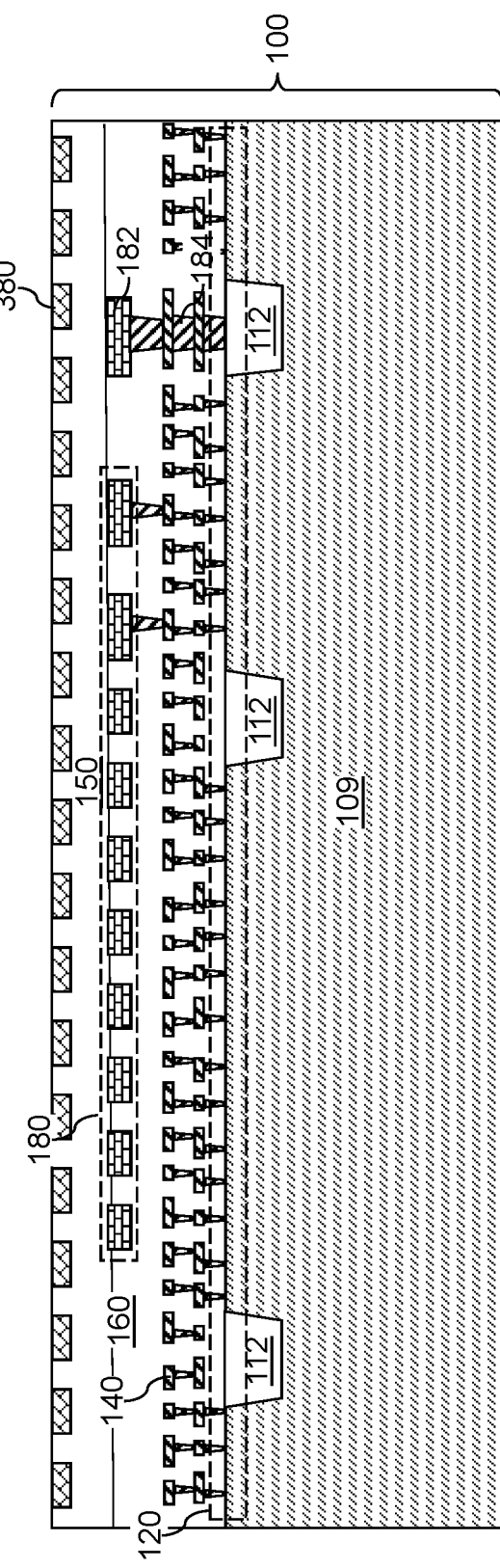
FIG. 15 is a vertical cross-sectional view of the second structure after formation of a patterned magnetic shielding layer according to the second embodiment of the present disclosure.

Referring to FIG. 15, the patterned magnetic shielding layer 380 may be formed in an upper portion of the first insulating layer 150. The patterned magnetic shielding layer 380 may have the same material composition, the same thickness range, and the same pattern, as disclosed above with respect to the first structure illustrated in FIGS. 1-13.

Figure 16:
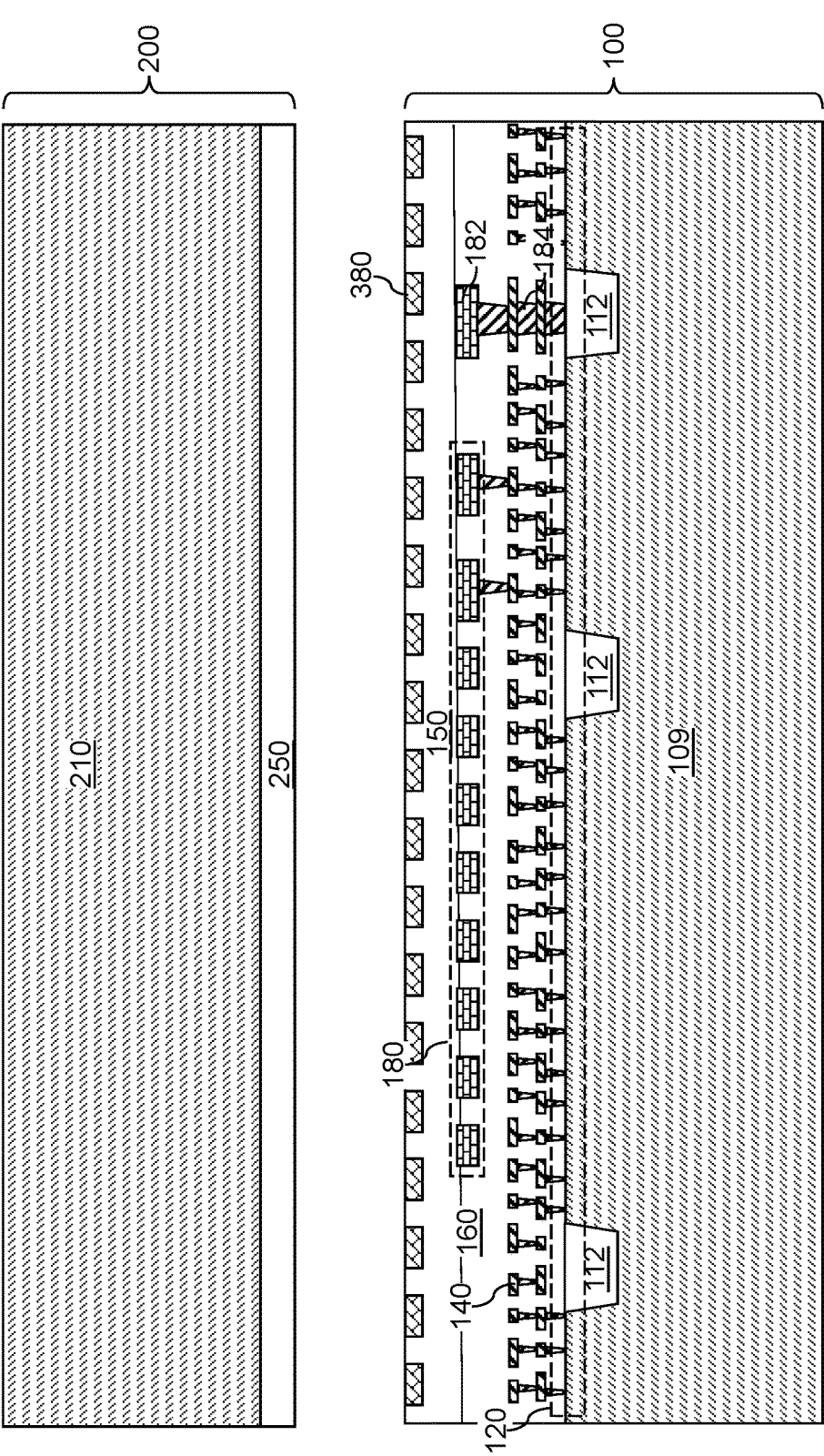
FIG. 16 is a vertical cross-sectional view of the second structure after providing a second semiconductor substrate with a second insulating layer thereupon according to the second embodiment of the present disclosure.

Referring to FIG. 16, a second assembly 200 including a handle substrate 210 and a second insulating layer 250 comprising a second insulating material is provided. The second assembly 200 used in the second structure may be the same as the second assembly 200 described with reference to FIGS. 5-8.

In embodiments in which the patterned magnetic shielding layer 380 is formed within the first insulating layer 150, formation of another patterned magnetic shielding layer in the second insulating layer 250 is optional, and may be omitted. In embodiments in which the patterned magnetic shielding layer is not formed within the first insulating layer 150, a patterned magnetic shielding layer 380 may be formed in the second insulating layer 250. Generally, one of the first insulating layer 150 and the second insulating layer 250 embeds a patterned magnetic shielding layer 380 comprising at least one portion of a ferromagnetic material having relative permeability of at least 20.

Figure 17:
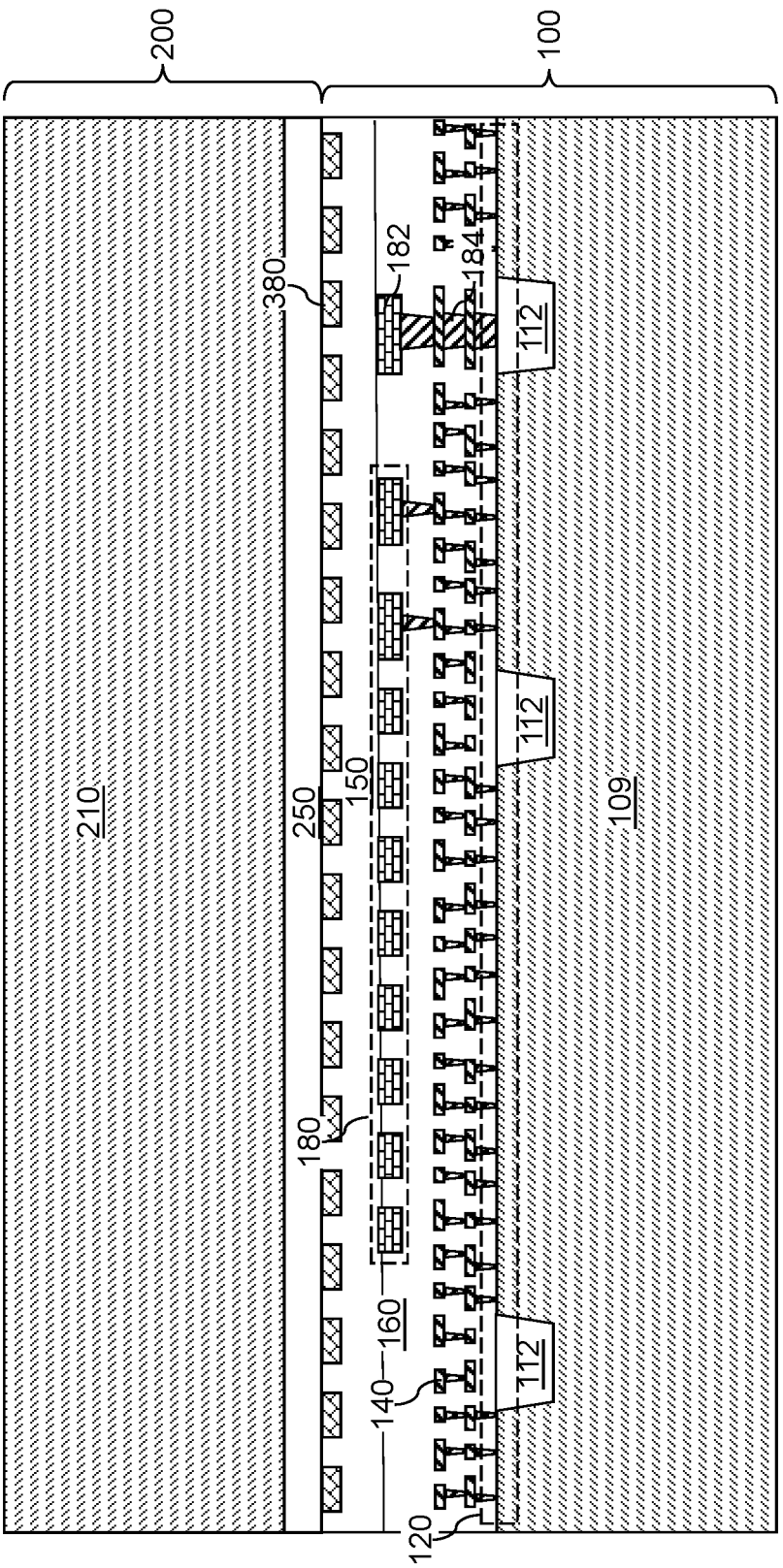
FIG. 17 is a vertical cross-sectional view of the second structure after bonding the second insulating layer to the first insulating layer according to the second embodiment of the present disclosure.

Referring to FIG. 17, the first assembly 100 and the second assembly 200 are brought into contact with each other such that the first insulating layer 150 contacts the second insulating layer 250. A thermocompression dielectric-to-dielectric bonding process may be performed to bond the first insulating layer 150 with the second insulating layer 250. For example, if the first insulating layer 150 and the second insulating layer 250 comprise silicon oxide materials such as TEOS-based silicon-oxide materials, the thermocompression dielectric-to-dielectric bonding process may comprise an oxide-to-oxide bonding process performed at an elevated temperature in a range from 100 degrees Celsius to 350 degrees Celsius, such as from 150 degrees Celsius to 250 degrees Celsius.

Figure 18:
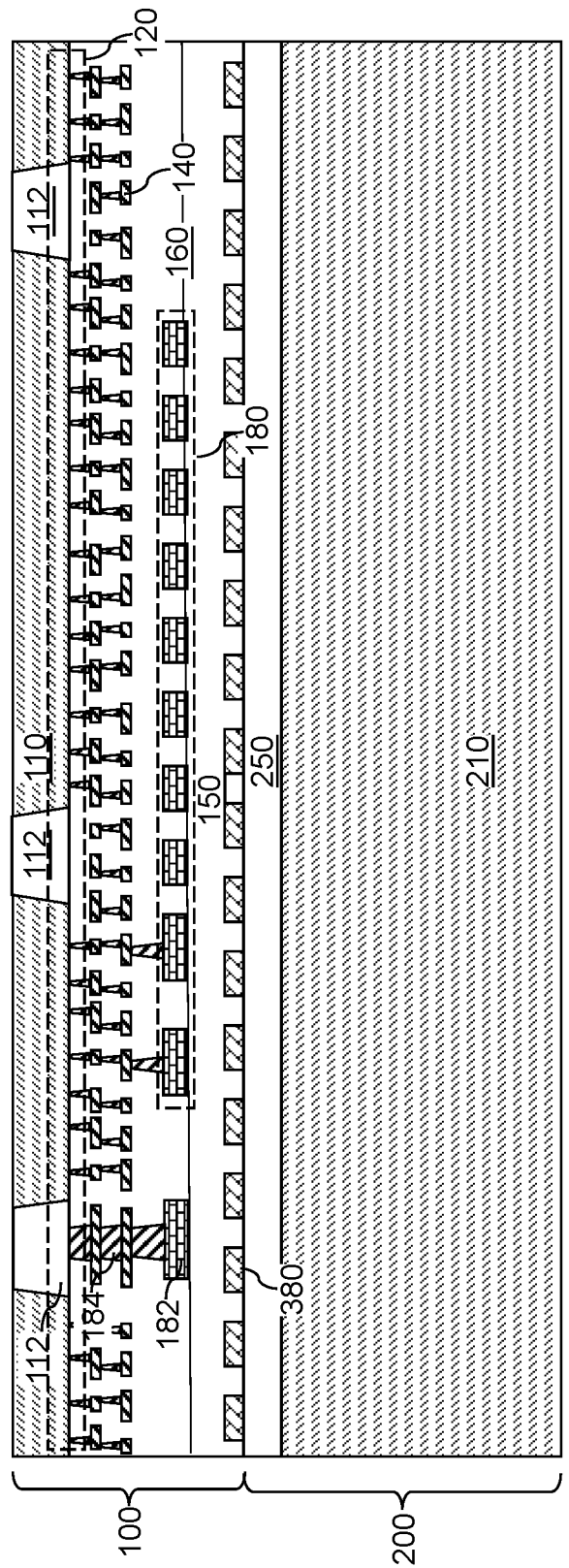
FIG. 18 is a vertical cross-sectional view of the second structure after thinning the first semiconductor substrate according to the second embodiment of the present disclosure.

Referring to FIG. 18, the first semiconductor substrate 109 may be thinned by removing the backside portion of the first semiconductor substrate 109. For example, the backside portion of the first semiconductor substrate 109 may be removed by grinding, polishing, an isotropic etch process, and/or an anisotropic etch process. A remaining portion of the first semiconductor substrate 109 comprises a semiconductor material layer 110. The thickness of the semiconductor material layer 110 may be in a range from 100 nm to 5,000 nm, such as from 200 nm to 2,000 nm, although lesser and greater thicknesses may also be used.

The thickness of the semiconductor material layer 110 may, or may not, be greater than the thickness of the shallow trench isolation structures 112. In some embodiments, backside surfaces of the shallow trench isolation structures 112 may be physically exposed after thinning the first semiconductor substrate 109 into the semiconductor material layer 110. In some other embodiments, the shallow trench isolation structures 112 may not be physically exposed after thinning the first semiconductor substrate 109 into the semiconductor material layer 110. In one embodiment, the semiconductor material layer 110 may comprise, and/or may consist of, a single crystalline semiconductor material layer such as a single crystalline silicon layer. The first assembly 100 comprises a semiconductor material layer 110, semiconductor devices 120 located on the semiconductor material layer 110, and dielectric material layers 160 embedding metal interconnect structures 140 and an inductor structure 180 and located over the semiconductor material layer. The handle substrate 210 (comprising a second semiconductor substrate) provides structural support to the first assembly 100, and prevents breakage of the semiconductor material layer 110 which as a lesser thickness than the first semiconductor substrate 109. The second structure may be flipped upside down after thinning the first semiconductor substrate 109 into the semiconductor material layer 110.

The second structure after the processing steps of FIG. 18 may comprise a handle substrate 210; a patterned magnetic shielding layer 380 comprising at least one portion of a ferromagnetic material having relative permeability of at least 20 and located over the handle substrate 210; a semiconductor material layer 110 overlying the patterned magnetic shielding layer 380; semiconductor devices 120 located on the semiconductor material layer 110; metal interconnect structures 140 embedded within dielectric material layers 160 and electrically connected to the semiconductor devices 120; and an inductor structure 180 embedded within the dielectric material layers 160.

At least one insulating layer (150, 250) may be provided, which embeds the patterned magnetic shielding layer 380 and is located between the handle substrate 210 and the semiconductor material layer 110. In one embodiment, the at least one insulating layer (150, 250) comprises: a first insulating layer 150 underlying the semiconductor material layer 110 and comprising a first insulating material; and a second insulating layer 250 underlying the first insulating layer 150 and comprising a second insulating material that is bonded to the first insulating material. In embodiments in which one of the first insulating layer 150 and the second insulating layer 250 is omitted, the patterned magnetic shielding layer 380 may be embedded in the other of the first insulating layer 150 and the second insulating layer 250 such that the patterned magnetic shielding layer 380 is vertically spaced from each of the semiconductor material layer 110 and the handle substrate 210.

In one embodiment, the first insulating material comprises a first silicon oxide material; and the second insulating material comprises a second silicon oxide material. In one embodiment, the patterned magnetic shielding layer 380 is in contact with the first insulating layer 150 and with the second insulating layer 250. In one embodiment, the patterned magnetic shielding layer 380 comprises first horizontal surfaces that are proximal to the semiconductor material layer 110 and second horizontal surfaces that are proximal to the handle substrate 210 and vertically spaced from the first horizontal surfaces by a thickness of the patterned magnetic shielding layer 380; and the first horizontal surfaces are located within a same horizontal plane as bonding interfaces between the first insulating layer 150 and the second insulating layer 250.

In one embodiment, the patterned magnetic shielding layer 380 comprises a plurality of discrete patterned magnetic shielding material portions having a same vertical thickness and laterally spaced from one another and not in direct contact with one another (for example, as illustrated in configurations of FIGS. 4B, 4C, and 4D). In one embodiment, the patterned magnetic shielding layer 380 comprise a continuous magnetic shielding material layer including a plurality of openings therethrough; and insulating material portions (which may be portions of the first insulating layer 150 or the second insulating layer 250) are located in each of the plurality of openings in the continuous magnetic shielding material layer (for example, as illustrated in configurations of FIGS. 4E and 4F).

Figure 19:
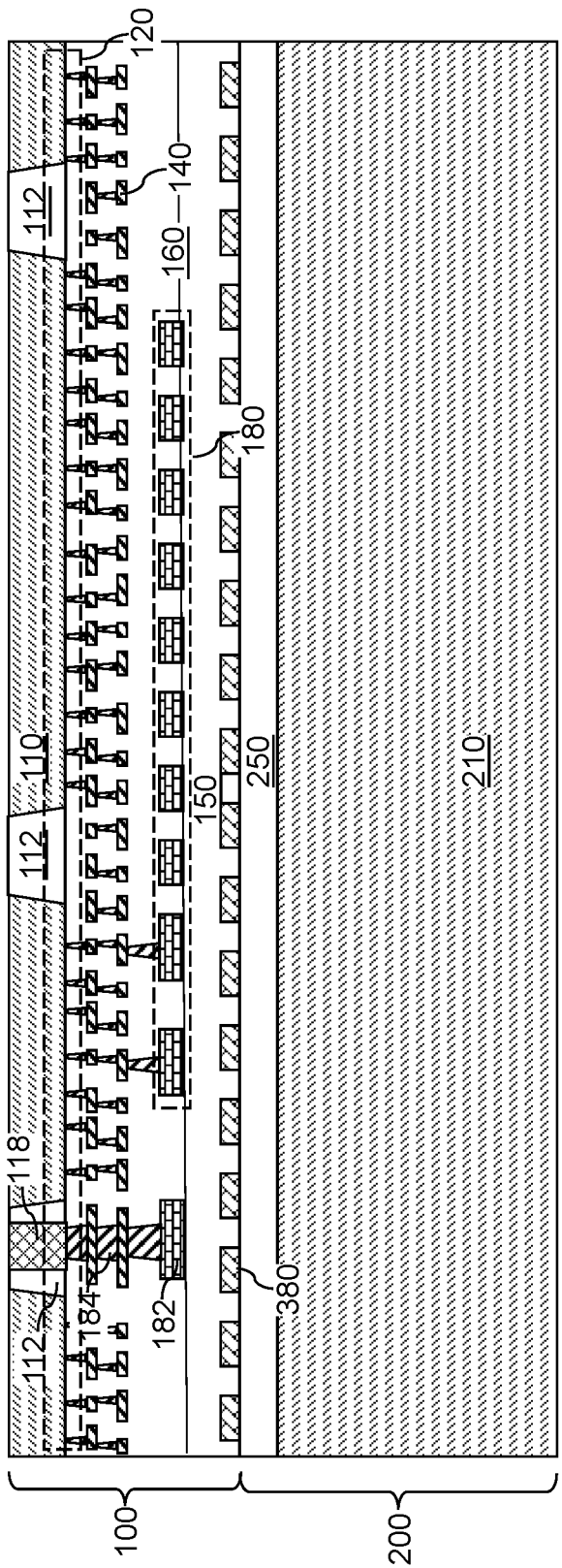
FIG. 19 is a vertical cross-sectional view of the second structure after formation of a through-substrate via structure according to the second embodiment of the present disclosure.

Referring to FIG. 19, a through-substrate via structure 118 may be formed through one of the shallow trench isolation structures 112 directly on one of the antenna connection structures (182, 184) embedded within the dielectric material layers 160. For example, a photoresist layer (not shown) may be applied over the physically exposed backside surface (which is the top surface in the orientation illustrated in FIG. 19) of the semiconductor material layer 110, and may be lithographically patterned to form an opening in an area that overlies the antenna connection structures (182, 184). An anisotropic etch process may be performed to form a through-substrate via cavity that vertically extends through the shallow trench isolation structure 112 that overlies the antenna connection structures (182, 184). In embodiments in which the thickness of the semiconductor material layer 110 is greater than the thickness of the shallow trench isolation structures 112 (i.e., in case semiconductor surfaces of semiconductor material layer 110 are physically exposed to the through-substrate via cavity), an insulating spacer (not shown) may be formed at a periphery of the through-substrate via cavity. At least one conductive material (such as at least one metallic material) may be deposited in the through-substrate via cavity and directly on one of the antenna connection structures (182, 184), and excess portions of the at least one conductive material may be removed from outside the through-substrate via cavity. The remaining portion of the at least one conductive material constitutes the through-substrate via structure 118, which may be a metallic via structure having a top surface that is coplanar with the top surface (i.e., the backside surface) of the semiconductor material layer 110.

Figure 20:
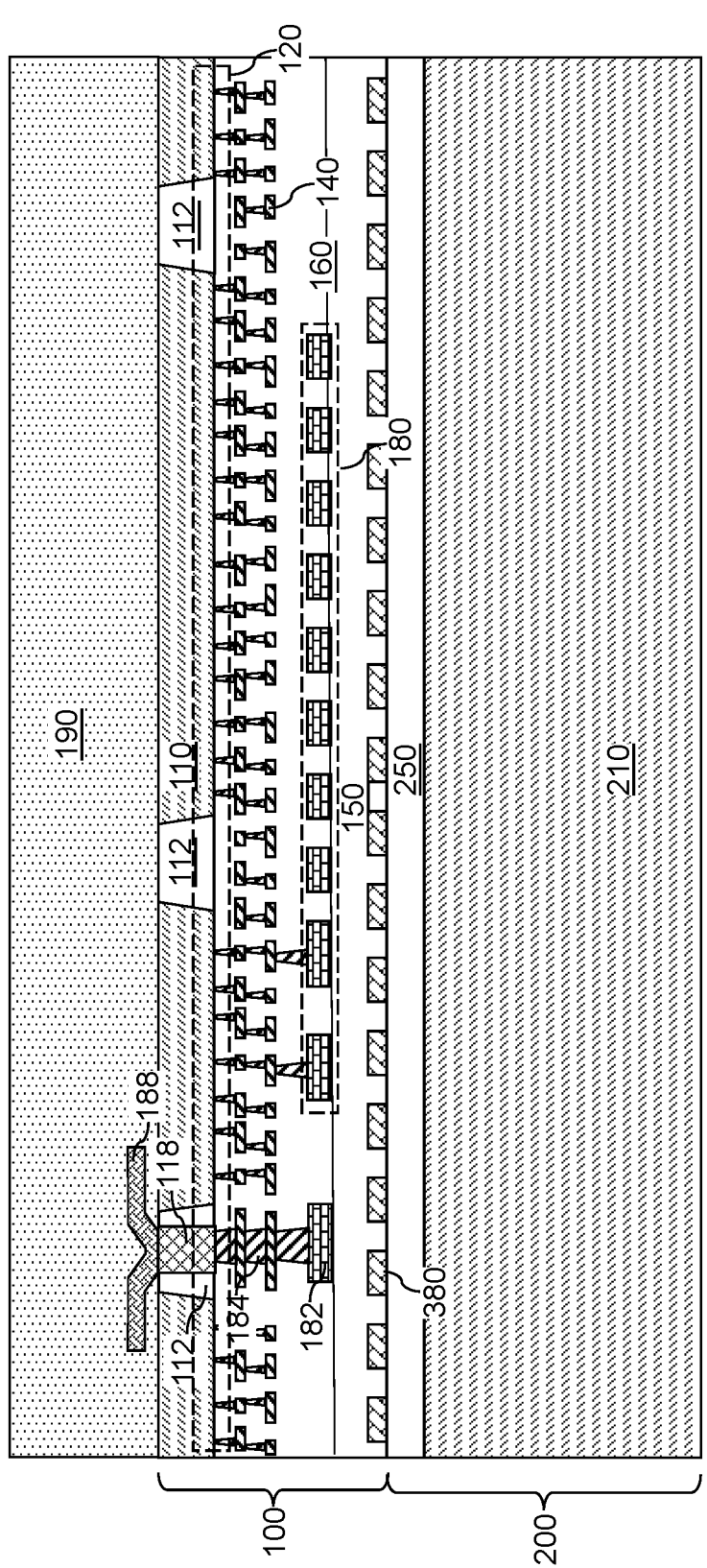
FIG. 20 is a vertical cross-sectional view of the second structure after formation of a radio-frequency antenna and a molding compound layer according to the second embodiment of the present disclosure.

Referring to FIG. 20, a radio-frequency antenna 188 may be formed on the through-substrate via structure 118. Any radio-frequency antenna known in the art may be used for the radio-frequency antenna 188 of the present disclosure. Optionally, a backside insulating layer (not shown) may be formed on the backside surface (i.e., the top surface) of the semiconductor material layer 110 to prevent electrical shorts (i.e., non-intended electrical connections) between the radio-frequency antenna 188 and the semiconductor material layer 110. A molding compound layer 190 may be optionally formed over the radio-frequency antenna 188. The molding compound layer 190 provides mechanical protection to the radio-frequency antenna 188. The thickness of the molding compound layer 190 may be in a rang from 10 microns to 1 mm, although lesser and greater thicknesses may also be used.

Generally, the radio-frequency antenna 188 may be formed over the semiconductor material layer 110 such that the radio-frequency antenna 188 is electrically connected to the inductor structure 180, a subset of the metal interconnect structures 140, and a subset of the semiconductor devices 120. The patterned magnetic shielding layer 380 may be electrically floating, and may be electrically isolated from the semiconductor material layer 110 and the handle substrate 210.

The second structure comprises semiconductor devices 120 located on a first side of a semiconductor material layer 110; metal interconnect structures 140 embedded within dielectric material layers 160 and electrically connected to the semiconductor devices 120; an inductor structure 180 embedded within the dielectric material layers 160; a handle substrate 210 that underlies the semiconductor material layer 110; and a patterned magnetic shielding layer 380 comprising at least one portion of a ferromagnetic material having relative permeability of at least 20 and located between the semiconductor material layer 110 and the handle substrate 210.

FIGS. 21-25 illustrate alternative configurations of the second structure, which may be derived from the second structure by modifying the structure of the at least one insulating material layer (150, 250) and/or by forming additional metallic structures therein.

Figure 21:
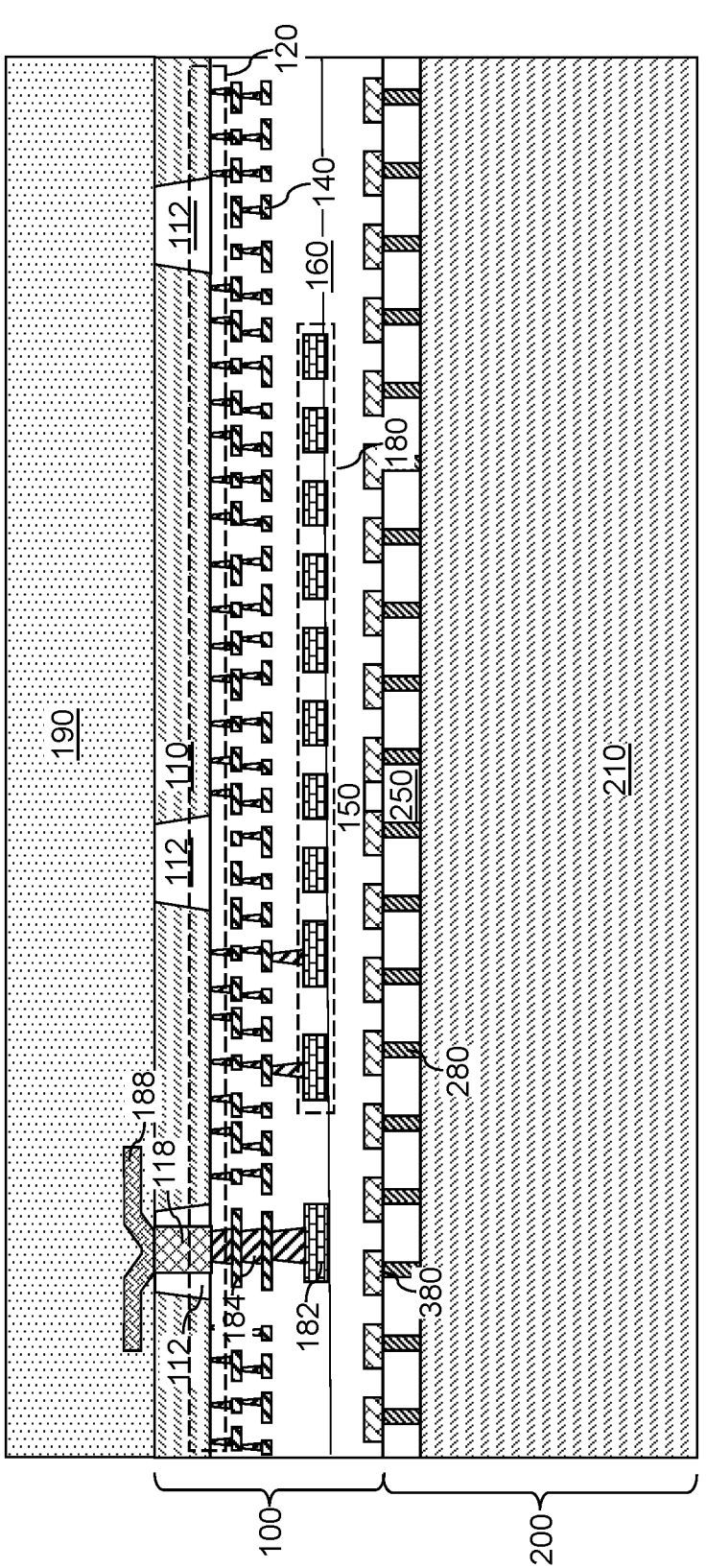
FIG. 21 is a vertical cross-sectional view of a first alternative configuration of the second structure according to the second embodiment of the present disclosure.

Referring to FIG. 21, a first alternative configuration of the second structure may be derived from the second structure by forming conductive via structures 280 through the second insulating layer 250. Upon bonding the first insulating layer 150 and the second insulating layer 250, the conductive via structures 280 contact, and provide electrically conductive paths between, the second semiconductor substrate of the handle substrate 210 and the patterned magnetic shielding layer 380. Thus, each portion of the patterned magnetic shielding layer 380 may be electrically connected to the handle substrate.

Figure 22:
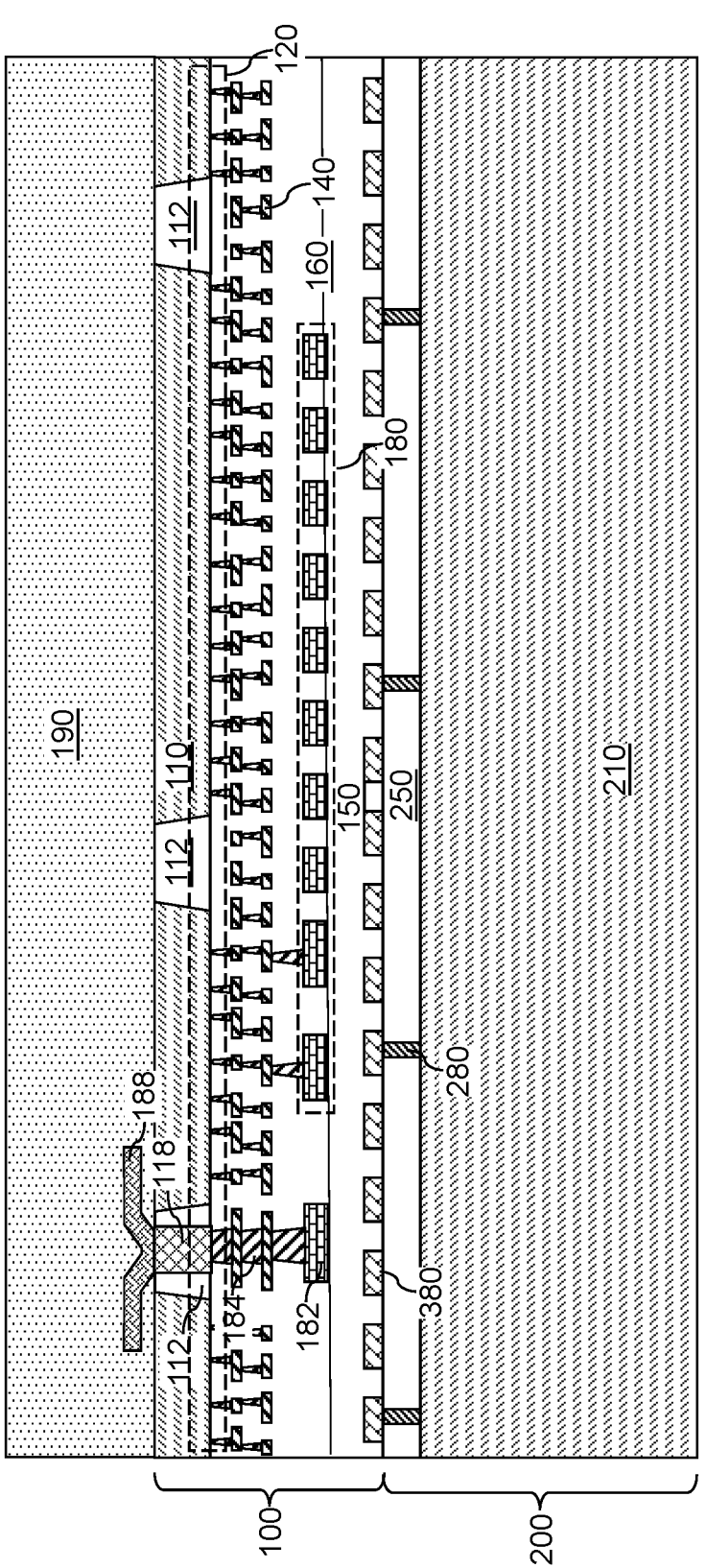
FIG. 22 is a vertical cross-sectional view of a second alternative configuration of the second structure according to the second embodiment of the present disclosure.

Referring to FIG. 22, a second alternative configuration of the second structure may be derived from the second structure by forming conductive via structures 280 through the second insulating layer 250. Upon bonding the first insulating layer 150 and the second insulating layer 250, the conductive via structures 280 contact, and provide electrically conductive paths between, the second semiconductor substrate of the handle substrate 210 and a subset of ferroelectric material portions of the patterned magnetic shielding layer 380. Thus, first portions of the patterned magnetic shielding layer 380 may be electrically connected to the handle substrate, and second portions of the patterned magnetic shielding layer 380 may be electrically floating.

Figure 23:
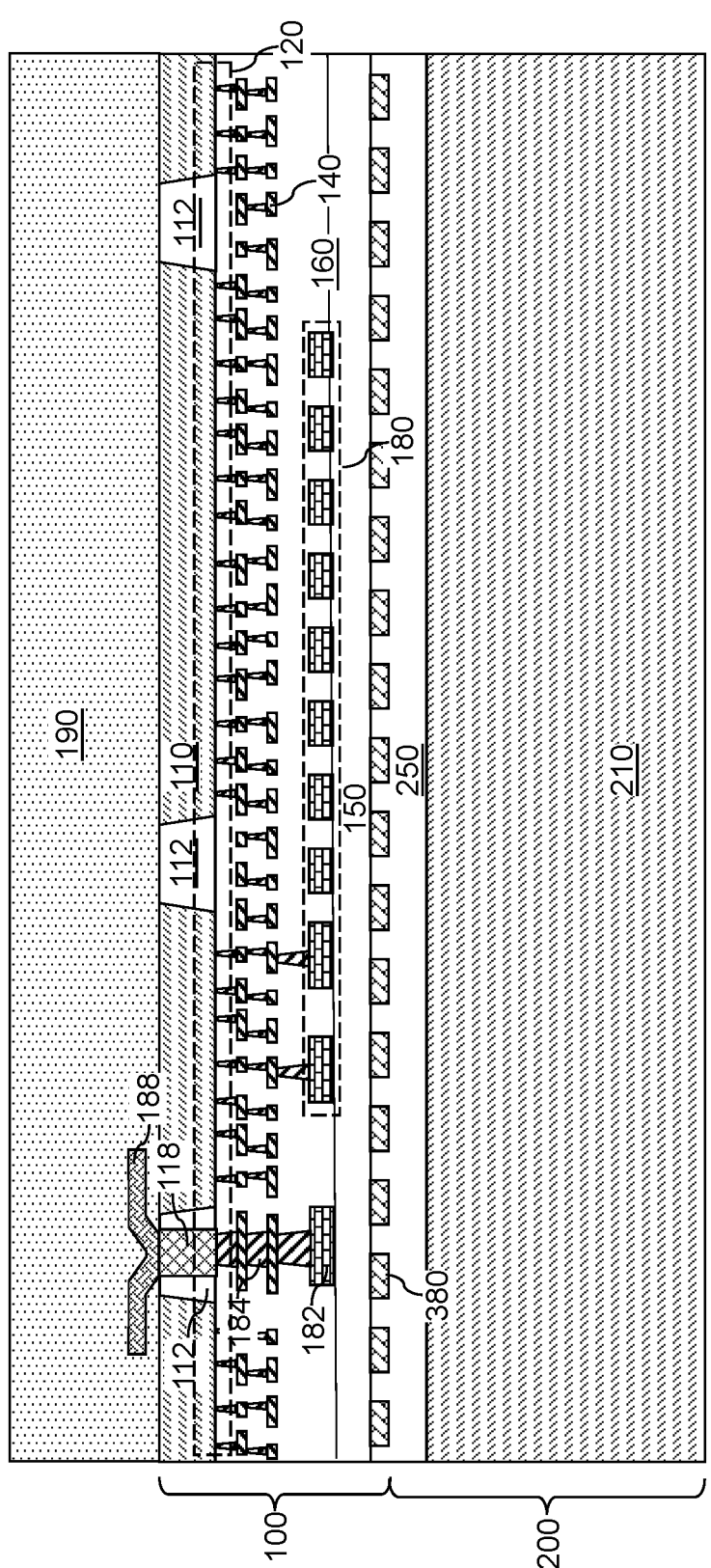
FIG. 23 is a vertical cross-sectional view of a third alternative configuration of the second structure according to the second embodiment of the present disclosure.
Figure 24:
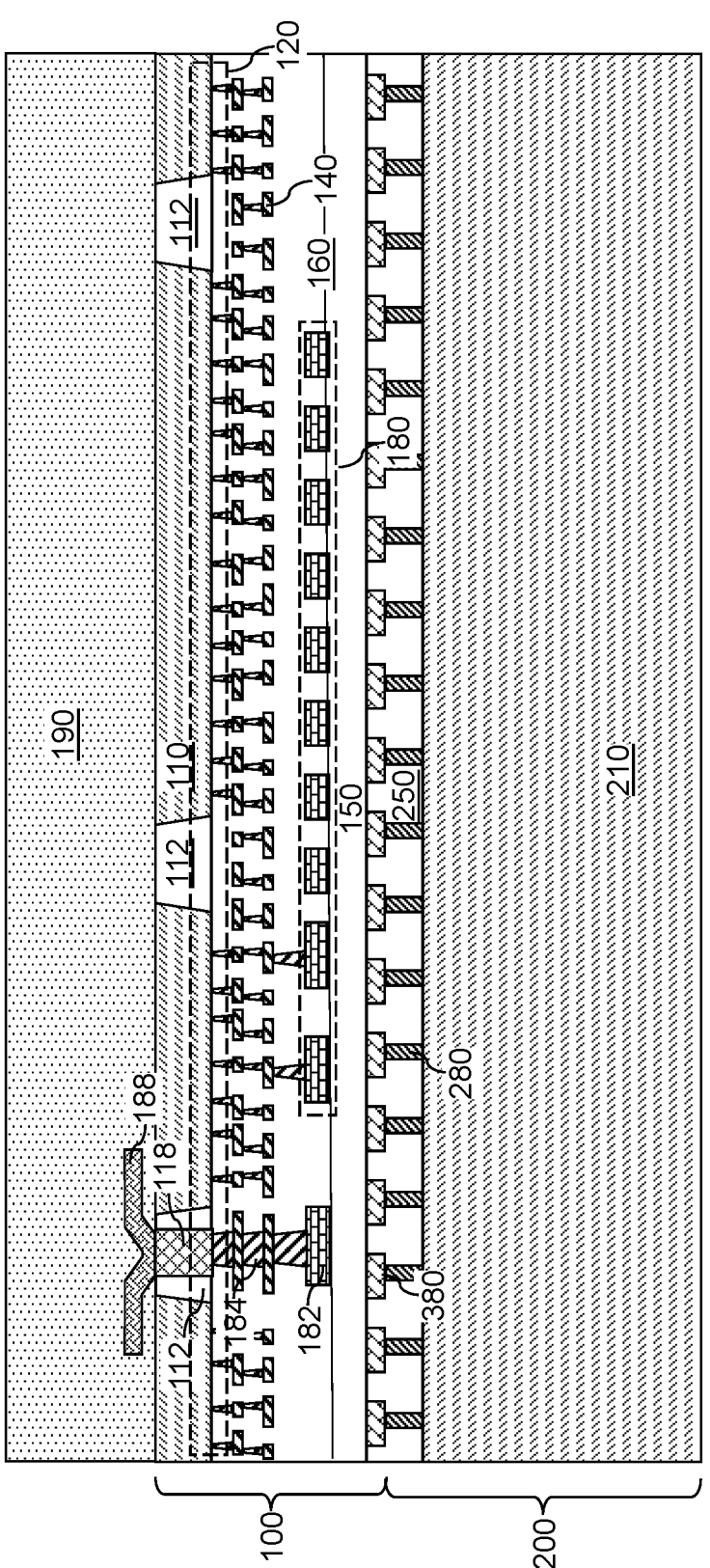
FIG. 24 is a vertical cross-sectional view of a fourth alternative configuration of the second structure according to the second embodiment of the present disclosure.

Referring to FIG. 23, a third alternative configuration of the second structure may be derived from the second structure by forming the patterned magnetic shielding layer in an upper portion of the second insulating layer 250 instead of a bottom portion of the second insulating layer 150. In this embodiment, the patterned magnetic shielding layer 380 may be embedded in the second insulating layer 250. In one embodiment, the patterned magnetic shielding layer 380 comprises first horizontal surfaces that are proximal to the semiconductor material layer 110 and second horizontal surfaces that are proximal to the handle substrate 210 and vertically spaced from the first horizontal surfaces by a thickness of the patterned magnetic shielding layer 380; and the first horizontal surfaces are located within a same horizontal plane as bonding interfaces between the first insulating layer 150 and the second insulating layer 250. Referring to FIG. 24, a fourth alternative configuration of the second structure may be derived from the third alternative configuration of the second structure by forming conductive via structures 280 in a lower portion of the second insulating layer 250 prior to formation of the patterned magnetic shielding layer 380 in an upper portion of the second insulating layer. The conductive via structures 280 contact, and provide electrically conductive paths between, the second semiconductor substrate of the handle substrate 210 and the patterned magnetic shielding layer 380. Thus, each portion of the patterned magnetic shielding layer 380 may be electrically connected to the handle substrate.

Figure 25:
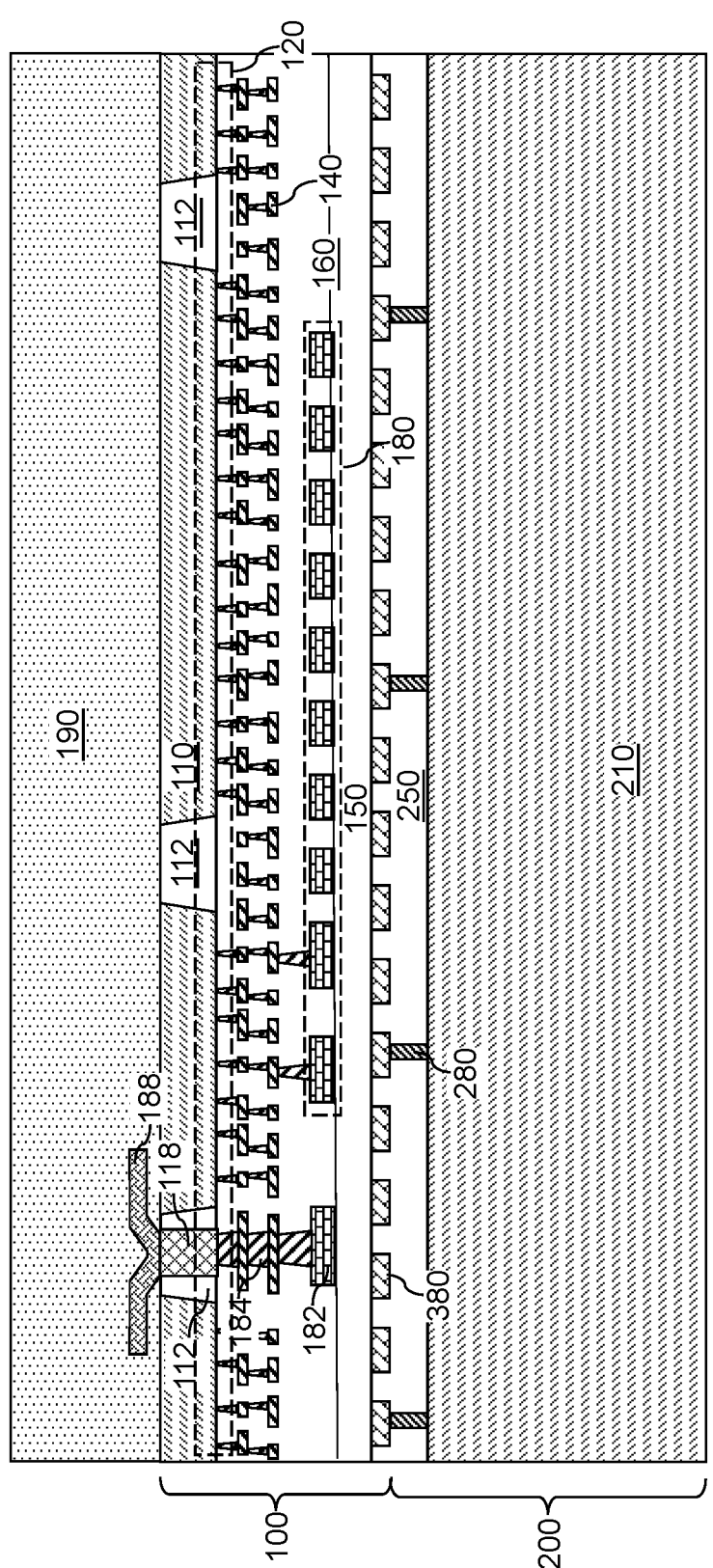
FIG. 25 is a vertical cross-sectional view of a fifth alternative configuration of the second structure according to the second embodiment of the present disclosure.

Referring to FIG. 25, a fifth alternative configuration of the second structure may be derived from the third structure by forming conductive via structures 280 in a lower portion of the second insulating layer 250 prior to formation of the patterned magnetic shielding layer 380 in an upper portion of the second insulating layer 250. The conductive via structures 280 contact, and provide electrically conductive paths between, the second semiconductor substrate of the handle substrate 210 and a subset of ferroelectric material portions of the patterned magnetic shielding layer 380. Thus, first portions of the patterned magnetic shielding layer 380 may be electrically connected to the handle substrate 210, and second portions of the patterned magnetic shielding layer 380 may be electrically floating.

Figure 26:
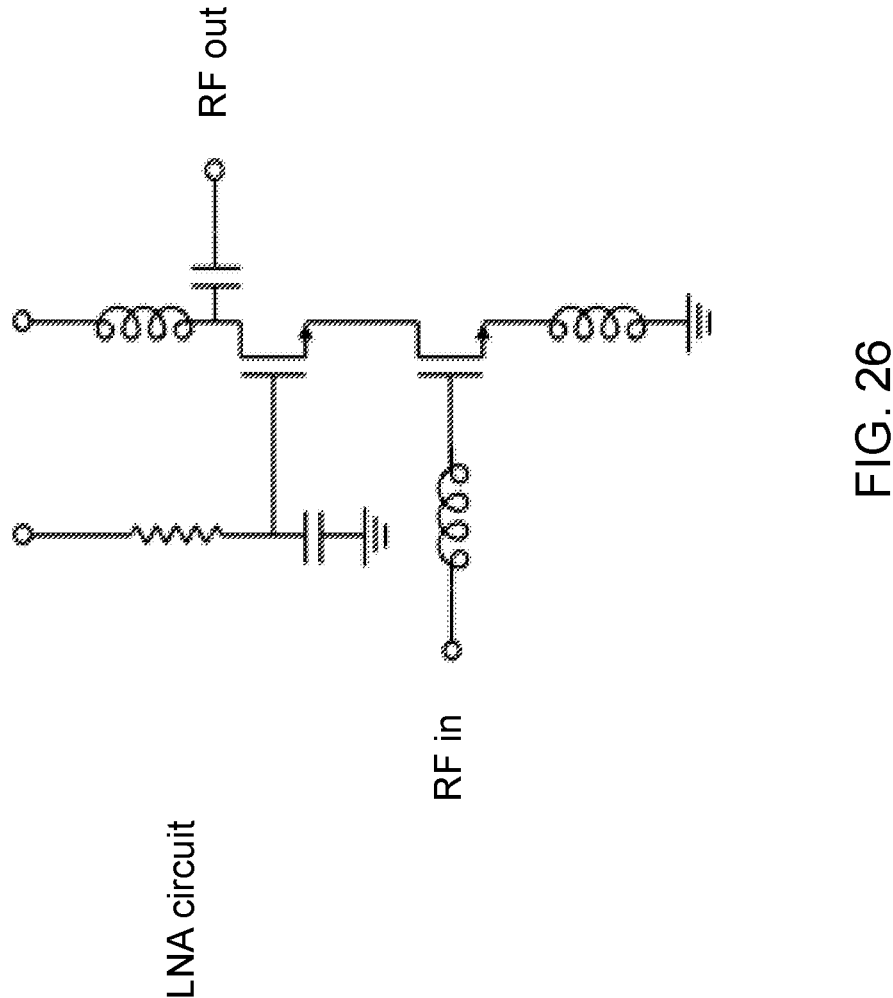
FIG. 26 is a schematic circuit diagram of the low noise amplifier circuit that may be provided by the semiconductor devices in the first structure and second structure of the present disclosure.

Generally, the semiconductor devices 120 may comprise any type of radio-frequency circuits known in the art. In one embodiment, the semiconductor devices 120 may comprise any radio-frequency (RF) front-end module (FEM), which may be a device that amplifies a radio-frequency signal and increases the distance and the strength of a link's connection provided through the radio-frequency signal. In addition to extending the range, an RF FEM also increases the robustness of the link connection. For example, the semiconductor devices 120 may comprise low noise amplifier (LNA) circuits and power amplification circuits. FIG. 26 is a circuit diagram of a low noise amplifier (LNA) circuit that may be provided by the semiconductor devices 120.

FIG. 27 is a first process flowchart for forming the first structure or the second structure of the present disclosure.

Referring to step 2710 and FIGS. 1-3 and 14, a first assembly 100 is provided, which comprises a first semiconductor substrate 109, semiconductor devices 120 located on the first semiconductor substrate 109, and dielectric material layers 160 embedding metal interconnect structures 140 and an inductor structure 180 and located over the first semiconductor substrate 109.

Referring to step 2720 and FIGS. 4A-4G, 9-13, 14, 15, and 21-25, a first insulating layer 150 comprising a first insulating material may be formed on the first assembly 100.

Referring to step 2730 and FIGS. 5, 9-13, 16, and 21-25, a second assembly 200 may be provided, which includes a handle substrate 210 and a second insulating layer 250 comprising a second insulating material. One of the first insulating layer 150 and the second insulating layer 250 embeds a patterned magnetic shielding layer 380 comprising at least one portion of a ferromagnetic material having relative permeability of at least 20.

Referring to step 2740 and FIGS. 6, 9-13, 17, and 21-25, the second insulating layer 250 may be bonded to the first insulating layer 150 by thermocompression dielectric-to-dielectric bonding.

Referring to step 2750 and FIGS. 7-13 and 18-25, a radio-frequency antenna 188 may be formed after the second insulating layer 250 is bonded to the first insulating layer 150 such that the radio-frequency antenna 188 is electrically connected to the inductor structure 180, a subset of the metal interconnect structures 140, and a subset of the semiconductor devices 120.

FIG. 28 is a second process flowchart for forming the first structure of the present disclosure.

Referring to step 2810 and FIG. 1, semiconductor devices 120 and dielectric material layers 160 embedding metal interconnect structures 140 and an inductor structure 180 may be formed over a first semiconductor substrate 109.

Referring to step 2820 and FIG. 2, a carrier substrate 410 may be attached to the dielectric material layers 160.

Referring to step 2830 and FIG. 3, the first semiconductor substrate 109 may be thinned. A remaining portion of the first semiconductor substrate 109 comprises a semiconductor material layer 110.

Referring to step 2840 and FIGS. 4A-4G, and 9-13, a first insulating layer 150 comprising a first insulating material may be formed on the semiconductor material layer 110.

Referring to step 2850 and FIGS. 5 and 9-13, a second assembly 200 may be provided, which includes a handle substrate 210 and a second insulating layer 250 comprising a second insulating material. One of the first insulating layer 150 and the second insulating layer 250 embeds a patterned magnetic shielding layer 380 comprising at least one portion of a ferromagnetic material having relative permeability of at least 20.

Referring to step 2860 and FIGS. 6 and 9-13, the second insulating layer 250 may be bonded to the first insulating layer 150 by thermocompression dielectric-to-dielectric bonding.

Referring to step 2870 and FIGS. 7 and 9-13, the carrier substrate 410 may be removed.

Referring to step 2880 and FIGS. 8-13, a radio-frequency antenna 188 may be formed over the dielectric material layers 160 such that the radio-frequency antenna 188 is electrically connected to the inductor structure 180, a subset of the metal interconnect structures 140, and a subset of the semiconductor devices 120.

FIG. 29 is a third process flowchart for forming the second structure or the second structure of the present disclosure.

Referring to step 2910 and FIGS. 1 and 14, semiconductor devices 120 and dielectric material layers 160 embedding metal interconnect structures 140 and an inductor structure 180 may be formed over a first semiconductor substrate 109.

Referring to step 2920 and FIGS. 14, 15, 16, and 21-25, a second insulating layer 250 comprising a second insulating material may be formed on a handle substrate 210. One of the first insulating layer 150 and the second insulating layer 250 embeds a patterned magnetic shielding layer 380 comprising at least one portion of a ferromagnetic material having relative permeability of at least 20.

Referring to step 2930 and FIGS. 17 and 21-25, the second insulating layer 250 may be bonded to the first insulating layer 150 by thermocompression dielectric-to-dielectric bonding.

Referring to step 2940 and FIGS. 18 and 21-25, the first semiconductor substrate 109 may be thinned. A remaining portion of the first semiconductor substrate 109 comprises a semiconductor material layer 110.

Referring to step 2950 and FIGS. 19 and 21-25, a through-substrate via structure 118 may be formed through the semiconductor material layer 110.

Referring to step 2960 and FIGS. 20-25, a radio-frequency antenna 188 may be formed such that the radio-frequency antenna 188 is electrically connected to the inductor structure 180, a subset of the metal interconnect structures 140, and a subset of the semiconductor devices 120.

Referring to all drawings and according to various embodiments of the present disclosure, a semiconductor structure is provided, which comprises: a handle substrate 210; a patterned magnetic shielding layer 380 comprising at least one portion of a ferromagnetic material having relative permeability of at least 20 and located over the handle substrate 210; a semiconductor material layer 110 overlying the patterned magnetic shielding layer 380; semiconductor devices 120 located on the semiconductor material layer 110; metal interconnect structures 140 embedded within dielectric material layers 160 and electrically connected to the semiconductor devices 120; and an inductor structure 180 embedded within the dielectric material layers 160.

In one embodiment, the semiconductor structure may further include at least one insulating layer (150, 250) embedding the patterned magnetic shielding layer 380 and located between the handle substrate 210 and the semiconductor material layer 110. In one embodiment, the semiconductor structure may include at least one insulating layer (150, 250) that may include: a first insulating layer 150 underlying the semiconductor material layer 110 and may include a first insulating material; and a second insulating layer 250 underlying the first insulating layer 150 and comprising a second insulating material that may be bonded to the first insulating material 150. In one embodiment, the semiconductor structure wherein: the first insulating material comprises a first silicon oxide material; and the second insulating material comprises a second silicon oxide material. In one embodiment, the semiconductor structure, wherein the patterned magnetic shielding layer 380 may be in contact with the first insulating layer 150 and with the second insulating layer 250. In one embodiment, the semiconductor structure, wherein: the patterned magnetic shielding layer 380 may include first horizontal surfaces that are proximal to the semiconductor material layer 110 and second horizontal surfaces that are proximal to the handle substrate 210 and vertically spaced from the first horizontal surfaces by a thickness of the patterned magnetic shielding layer 380; and the first horizontal surfaces are located within a same horizontal plane as bonding interfaces between the first insulating layer 150 and the second insulating layer 250. In one embodiment, the semiconductor structure may further include a radio-frequency antenna 188 overlying the dielectric material layers 160 and electrically coupled to the inductor structure 180, a subset of the metal interconnect structures 140, and a subset of the semiconductor devices 120.

According to an aspect of the present disclosure, a semiconductor structure is provided, which comprises: semiconductor devices 120 located on a first side of a semiconductor material layer 110; metal interconnect structures 140 embedded within dielectric material layers 160 and electrically connected to the semiconductor devices 120; an inductor structure 180 embedded within the dielectric material layers 160; a handle substrate 210 that underlies the semiconductor material layer 110; and a patterned magnetic shielding layer 380 comprising at least one portion of a ferromagnetic material having relative permeability of at least 20 and located between the semiconductor material layer 110 and the handle substrate 210.

In one embodiment, the semiconductor structure may further include at least one insulating layer (150, 250) embedding the patterned magnetic shielding layer 380 and located between the handle substrate 210 and the inductor structure 180. In one embodiment, the semiconductor structure, wherein the at least one insulating layer 150 comprises: a first insulating layer overlying the inductor structure and comprising a first insulating material; and a second insulating layer 250 overlying the first insulating layer and comprising a second insulating material that is bonded to the first insulating material. In one embodiment, the semiconductor structure, wherein: the first insulating material comprises a first silicon oxide material; and the second insulating material comprises a second silicon oxide material. In one embodiment, the semiconductor structure, wherein the patterned magnetic shielding layer 380 may be in contact with the first insulating layer 150 and with the second insulating layer 250. In one embodiment, the semiconductor structure, wherein: the patterned magnetic shielding layer 380 comprises first horizontal surfaces that are proximal to the semiconductor material layer 110 and second horizontal surfaces that are proximal to the handle substrate 210 and vertically spaced from the first horizontal surfaces by a thickness of the patterned magnetic shielding layer 380; and the first horizontal surfaces are located within a same horizontal plane as bonding interfaces between the first insulating layer 150 and the second insulating layer 250. In one embodiment, the semiconductor structure may further include: a radio-frequency antenna 188 underlying the semiconductor material layer 110; and a through-substrate via structure 118 electrically connecting the radio-frequency antenna 188, the inductor structure 180, a subset of the metal interconnect structures 140, and a subset of the semiconductor devices 120.

According to an aspect of the present disclosure, the patterned magnetic shielding layer 380 may be provided between the semiconductor material layer 110 and the handle substrate 210 to mitigate substrate loss due to eddy current that may be induced in the handle substrate 210, and increases the Q-factors of various resonant components within the radio-frequency front end module. The patterned magnetic shielding layer 380 suppresses the electric field, the magnetic field, and the parasitic eddy current, and the parasitic capacitance in the handle substrate 210. Thus, the performance of the radio-frequency front end module may be enhanced due to the patterned magnetic shielding layer 380. The resistivity of the handle substrate 210 may be selected at a high value to further enhance the performance of the radio-frequency front end module, or may be selected in a manner that provides high performance for the radio-frequency front end module while economizing the manufacturing process by reducing the cost of the handle substrate 210 (e.g., by using a cost-effective silicon substrate providing a moderately high electrical resistivity).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
a handle substrate;
a patterned magnetic shielding layer comprising at least one portion of a ferromagnetic material having relative permeability of at least 20 and located over the handle substrate;
a semiconductor material layer overlying the patterned magnetic shielding layer;
semiconductor devices located on the semiconductor material layer;
metal interconnect structures embedded within dielectric material layers and electrically connected to the semiconductor devices;
an inductor structure embedded within the dielectric material layers; and
at least one insulating layer embedding the patterned magnetic shielding layer and located between the handle substrate and the semiconductor material layer.

2. The semiconductor structure of claim 1, wherein the at least one insulating layer comprises:
a first insulating layer underlying the semiconductor material layer and comprising a first insulating material; and
a second insulating layer underlying the first insulating layer and comprising a second insulating material that is bonded to the first insulating material.

3. The semiconductor structure of claim 2, wherein:
the first insulating material comprises a first silicon oxide material; and
the second insulating material comprises a second silicon oxide material.

4. The semiconductor structure of claim 2, wherein the patterned magnetic shielding layer is in contact with the first insulating layer and with the second insulating layer.

5. The semiconductor structure of claim 4, wherein:
the patterned magnetic shielding layer comprises first horizontal surfaces that are proximal to the semiconductor material layer and second horizontal surfaces that are proximal to the handle substrate and vertically spaced from the first horizontal surfaces by a thickness of the patterned magnetic shielding layer; and
the first horizontal surfaces are located within a same horizontal plane as bonding interfaces between the first insulating layer and the second insulating layer.

6. The semiconductor structure of claim 1, further comprising a radio-frequency antenna overlying the dielectric material layers and electrically coupled to the inductor structure, a subset of the metal interconnect structures, and a subset of the semiconductor devices.

7. The semiconductor structure of claim 1, wherein the patterned magnetic shielding layer comprises a material selected from Fe, Co, Ni, NiFe, CoFe, NiCo, NiCoFe, and CoZrTa.

8. The semiconductor structure of claim 1, wherein the handle substrate comprises a single crystalline silicon layer having a direct-current resistivity in a range from 1.0 $\Omega$cm to $3.0\times10^4$ $\Omega$-cm.

9. A semiconductor structure comprising:
semiconductor devices located on a first side of a semiconductor material layer;
metal interconnect structures embedded within dielectric material layers and electrically connected to the semiconductor devices;
an inductor structure embedded within the dielectric material layers;
a handle substrate that underlies the semiconductor material layer;
a patterned magnetic shielding layer comprising at least one portion of a ferromagnetic material having relative permeability of at least 20 and located between the semiconductor material layer and the handle substrate; and
at least one insulating layer embedding the patterned magnetic shielding layer and located between the handle substrate and the inductor structure.

10. The semiconductor structure of claim 9, wherein the at least one insulating layer comprises:
a first insulating layer overlying the inductor structure and comprising a first insulating material; and
a second insulating layer overlying the first insulating layer and comprising a second insulating material that is bonded to the first insulating material.

11. The semiconductor structure of claim 10, wherein:
the first insulating material comprises a first silicon oxide material; and the second insulating material comprises a second silicon oxide material.

12. The semiconductor structure of claim 10, wherein the patterned magnetic shielding layer is in contact with the first insulating layer and with the second insulating layer.

13. The semiconductor structure of claim 12, wherein:

the patterned magnetic shielding layer comprises first horizontal surfaces that are proximal to the semiconductor material layer and second horizontal surfaces that are proximal to the handle substrate and vertically spaced from the first horizontal surfaces by a thickness of the patterned magnetic shielding layer; and the first horizontal surfaces are located within a same horizontal plane as bonding interfaces between the first insulating layer and the second insulating layer.

14. The semiconductor structure of claim 9, further comprising:

a radio-frequency antenna underlying the semiconductor material layer; and a through-substrate via structure electrically connecting the radio-frequency antenna the inductor structure, a subset of the metal interconnect structures, and a subset of the semiconductor devices.

15. A method of forming a semiconductor structure;

providing a first assembly including a first semiconductor substrate, semiconductor devices located on the first semiconductor substrate, and dielectric material layers embedding metal interconnect structures and an inductor structure and located over the first semiconductor substrate;

forming a first insulating layer comprising a first insulating material on the first assembly;

providing a second assembly including a handle substrate and a second insulating layer comprising a second insulating material, wherein one of the first insulating layer and the second insulating layer embeds a patterned magnetic shielding layer comprising at least one portion of a ferromagnetic material having relative permeability of at least 20;

bonding the second insulating layer to the first insulating layer by thermocompression dielectric-to-dielectric bonding; and forming a radio-frequency antenna after the second insulating layer is bonded to the first insulating layer such that the radio-frequency antenna is electrically connected to the inductor structure, a subset of the metal interconnect structures, and a subset of the semiconductor devices.

16. The method of claim 15, wherein the first assembly is provided by:

forming the semiconductor devices, the metal interconnect structures, the inductor structure, and the dielectric material layers over a first semiconductor substrate;

attaching a carrier substrate to the dielectric material layers; and thinning the first semiconductor substrate from a backside, wherein a remaining portion of the first semiconductor substrate comprises the semiconductor material layer.

17. The method of claim 16, wherein the first insulating layer is formed on a backside of the semiconductor material layer.

18. The method of claim 15, wherein the first insulating layer is formed on top of the dielectric material layers and the inductor structure.

19. The method of claim 18, further comprising:

thinning the first semiconductor substrate after the second insulating layer is bonded to the first insulating layer, wherein a remaining portion of the first semiconductor substrate comprises a semiconductor material layer; and forming a through-substrate via structure through the semiconductor material layer, wherein the radio-frequency antenna is electrically connected to the inductor structure through the through-substrate via structure.

20. The method of claim 15, wherein the handle substrate comprises a single crystalline silicon layer having direct-current resistivity in a range from 1.0 $\Omega$-cm to $3.0 \times 10^4$ $\Omega$-cm, and has a thickness in a range from 100 microns to 2 mm.

* * * * *